US012641983B2

(12) United States Patent
Hirase et al.

(10) Patent No.: US 12,641,983 B2
(45) Date of Patent: May 26, 2026

(54) DISPLAY DEVICE AND METHOD OF MANUFACTURING DISPLAY DEVICE

(71) Applicant: SHARP KABUSHIKI KAISHA, Sakai City (JP)

(72) Inventors: Takeshi Hirase, Sakai City (JP); Yoshifumi Ohta, Sakai City (JP); Takashi Toyoda, Sakai City (JP); Takashi Ochi, Sakai City (JP); Akihiro Matsui, Sakai City (JP); Tohru Senoo, Sakai City (JP); Ayaka Nakano, Sakai City (JP); Yoshinobu Miyamoto, Sakai City (JP); Hideki Nakada, Sakai City (JP); Kazuteru Sawai, Sakai City (JP); Ryo Sato, Sakai City (JP); Tohru Sonoda, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 426 days.

(21) Appl. No.: 18/287,736

(22) PCT Filed: Apr. 23, 2021

(86) PCT No.: PCT/JP2021/016409
§ 371 (c)(1),
(2) Date: Oct. 20, 2023

(87) PCT Pub. No.: WO2022/224424
PCT Pub. Date: Oct. 27, 2022

(65) Prior Publication Data
US 2024/0188383 A1 Jun. 6, 2024

(51) Int. Cl.
*H10K 59/80* (2023.01)
*H10K 59/12* (2023.01)
(Continued)

(52) U.S. Cl.
CPC ..... *H10K 59/8722* (2023.02); *H10K 59/1201* (2023.02); *H10K 2102/351* (2023.02)

(58) Field of Classification Search
CPC ........... H10K 59/8722; H10K 59/1201; H10K 2102/351; H10K 59/124; G09F 9/30
See application file for complete search history.

(56) References Cited

U.S. PATENT DOCUMENTS 10,978,526 B2 * 4/2021 Qin ......................... H10K 71/00
2019/0363141 A1 11/2019 Ueno
(Continued)

FOREIGN PATENT DOCUMENTS

JP 2020-531881 A 11/2020
WO 2019/012583 A1 1/2019

*Primary Examiner* — David Vu
(74) *Attorney, Agent, or Firm* — ScienBiziP, P.C.

(57) ABSTRACT

A display device includes: a through hole provided through a resin layer and all layers that are provided as overlying and underlying layers of the resin layer; and a non-display area including, in an extension of at least one of a plurality of inorganic insulating films from a display area and at least partway through a thickness of the resin layer, a slit formed so as to surround at least a part of the through hole, wherein the slit has two opposing side faces at least either one of which has an upper portion including the at least one of the plurality of inorganic insulating films, and the at least one of the plurality of inorganic insulating films that is shaped like an eave is, in the slit, in direct contact with a first inorganic sealing film covering the display area and the non-display area including the slit.

19 Claims, 11 Drawing Sheets

(51) Int. Cl.
    H10K 59/124      (2023.01)
    *H10K 102/00*     (2023.01)

(56)          References Cited

U.S. PATENT DOCUMENTS

2020/0020752 A1   1/2020  Shi et al.
2020/0083475 A1   3/2020  Kang et al.

* cited by examiner (a)

DISPLAY DEVICE AND METHOD OF MANUFACTURING DISPLAY DEVICE

TECHNICAL FIELD

The present disclosure relates to display devices and methods of manufacturing a display device.

BACKGROUND ART

Various display devices have been developed that include light-emitting elements. Particularly, those display devices which include OLEDs (organic light-emitting diodes) or QLEDs (quantum-dot light-emitting diodes) are attracting great attention because of their feasibility, for example, for low power consumption, small thickness, and high image quality.

These display devices are increasingly complete with a through hole (imaging aperture) for directing light from a subject to an imaging element (camera).

For instance, Patent Literature 1 describes an EL device having a through hole (imaging aperture).

CITATION LIST

Patent Literature

Patent Literature 1: PCT International Application Publication WO2019/012583 A1

SUMMARY

Technical Problem

However, in the manufacture of the display device (EL device) that has a through hole (imaging aperture) like the EL device described in Patent Literature 1, to form a functional layer containing a light-emitting layer, in other words, to form, for example, at least one of a hole injection layer, a hole transport layer, a light-emitting layer, an electron transport layer, and an electron injection layer, an organic material is often vapor-deposited without using a vapor deposition mask that is designed in view of the through hole, and a continuous film of the organic material is formed of the vapor-deposited organic film around the through hole from the display area to a face where the through hole is provided. Additionally, at least one of the hole injection layer, the hole transport layer, the light-emitting layer, the electron transport layer, and the electron injection layer is often formed by applying an organic material, in which cases a continuous film of the organic material is similarly formed of the applied organic film around the through hole from the display area to the face where the through hole is provided. Therefore, for example, the water content having permeated through the face where the through hole is provided can have adverse effects on the light-emitting elements in the display area via the continuous, organic material film formed from the face where the through hole is provided to the display area, thereby disadvantageously degrading the reliability of the display device.

The present disclosure, in an aspect thereof, has been made in view of these problems and has an object to provide a highly reliable display device and a highly reliable method of manufacturing a display device.

Solution to Problem

An display device in accordance with the present disclosure, to address these problems, includes:
a resin layer;
a thin film transistor layer provided on the resin layer and including a plurality of inorganic insulating films;
a display area including a plurality of subpixels each including a light-emitting element including: a first electrode; a functional layer containing a light-emitting layer; and a second electrode, all of which are provided on the thin film transistor layer in a stated order when viewed from the thin film transistor layer;
a through hole at least partially surrounded by the display area and provided through the resin layer and all layers that are provided as overlying and underlying layers of the resin layer; and
a non-display area provided between the display area and the through hole and including, in an extension of at least one of the plurality of inorganic insulating films from the display area and at least partway through a thickness of the resin layer, a slit formed so as to surround at least a part of the through hole, wherein
the slit has two opposing side faces at least either one of which has an upper portion shaped like an eave protruding toward another one of the two opposing side faces of the slit, the upper portion including the at least one of the plurality of inorganic insulating films, and
the at least one of the plurality of inorganic insulating films that is shaped like an eave is, in the slit, in direct contact with a first inorganic sealing film covering the display area and the non-display area including the slit.

A method of manufacturing a display device in accordance with the present disclosure, to address the problems, includes:
a step of forming a resin substrate on a base body;
a step of forming an intermediate layer containing an inorganic film on the resin substrate;
a step of forming a resin layer on the intermediate layer;
a step of forming, on the resin layer: a thin film transistor layer containing a plurality of inorganic insulating films; and an extension of at least one of the plurality of inorganic insulating
a step of, after forming a slitty opening in the extension of the at least one of the plurality of inorganic insulating films, ashing the resin layer at least partway through a thickness of the resin layer via the opening to form a slit through the at least one of the plurality of inorganic insulating films and through the resin layer such that the slit has two opposing side faces at least either one of which has an upper portion shaped like an eave protruding toward another one of the two opposing side faces of the slit, the upper portion including the at least one of the plurality of inorganic insulating films;
a step, performed after the step of forming the slit, of forming a first electrode;
a step, performed after the step of forming the first electrode, of forming a functional layer containing a light-emitting layer;
a step, performed after the step of forming the functional layer containing the light-emitting layer, of forming a second electrode; and
a step, performed after the step of forming the second electrode, of forming a first inorganic sealing film on the extension of the at least one of the plurality of inorganic insulating films and on the thin film transistor layer, the first inorganic sealing film being in direct contact with the at least one of the plurality of inorganic insulating films that is shaped like an eave in the slit.

Effects of Disclosure

The present disclosure, in an aspect thereof, can provide a highly reliable display device and a highly reliable method of manufacturing a display device.

BRIEF DESCRIPTION OF DRAWINGS

FIG. 5 is a schematic cross-sectional view of a structure of a non-display area and a through hole of the display device in accordance with Embodiment 1.

DESCRIPTION OF EMBODIMENTS

Figure 1:
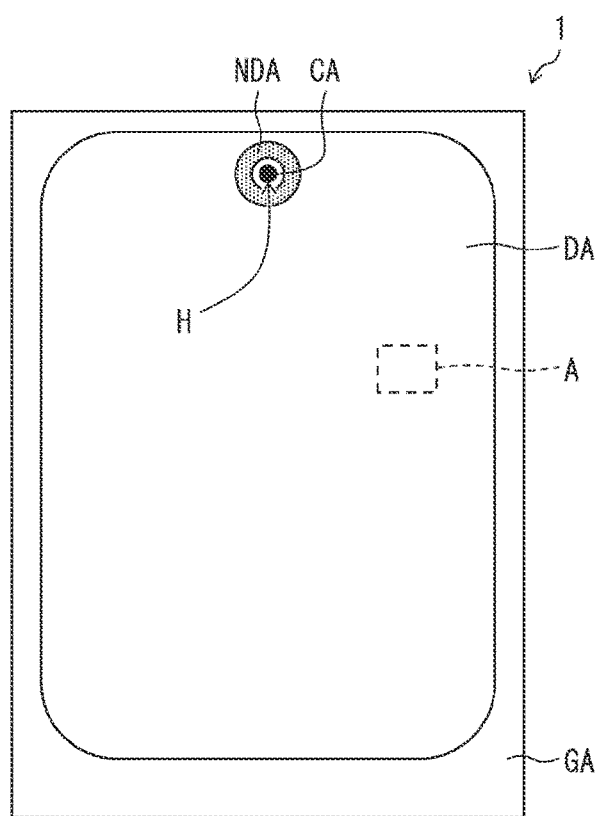
FIG. 1 is a schematic plan view of a structure of a display device in accordance with Embodiment 1.

The following will describe embodiments of the disclosure with reference to FIGS. 1 to 12. Throughout the following, members of an embodiment that have the same arrangement and function as members of a specific embodiment are indicated by the same reference numerals and description thereof may be omitted for convenience of description.

Embodiment 1

FIG. 1 is a schematic plan view of a structure of a display device 1 in accordance with Embodiment 1.

Referring to FIG. 1, the display device 1 includes a frame area GA, a display area DA, a non-display area NDA, and a through hole H. In the frame area GA, are there provided, for example, a driving driver and a terminal section (none shown). The through hole (imaging aperture) H is a hole through which light from a subject is directed to an imaging element CA (camera). Although the present embodiment discusses, as an example, the through hole H being completely surrounded by the display area DA, this is not the only possible implementation of the disclosure. Alternatively, for example, a part of a through hole H' may be surrounded by the display area DA as in a display device 1a in accordance with Embodiment 5 (detailed later). In other words, only at least a part of the through hole H needs to be surrounded by the display area DA. Additionally, although the present embodiment discusses, as an example, the through hole H being circular as shown in FIG. 1, this is not the only possible implementation of the disclosure. Alternatively, for example, the through hole H' may be quadrilateral and is not limited in shape in any particular manner as in the display device 1a in accordance with Embodiment 5 (detailed later).

Figure 2:
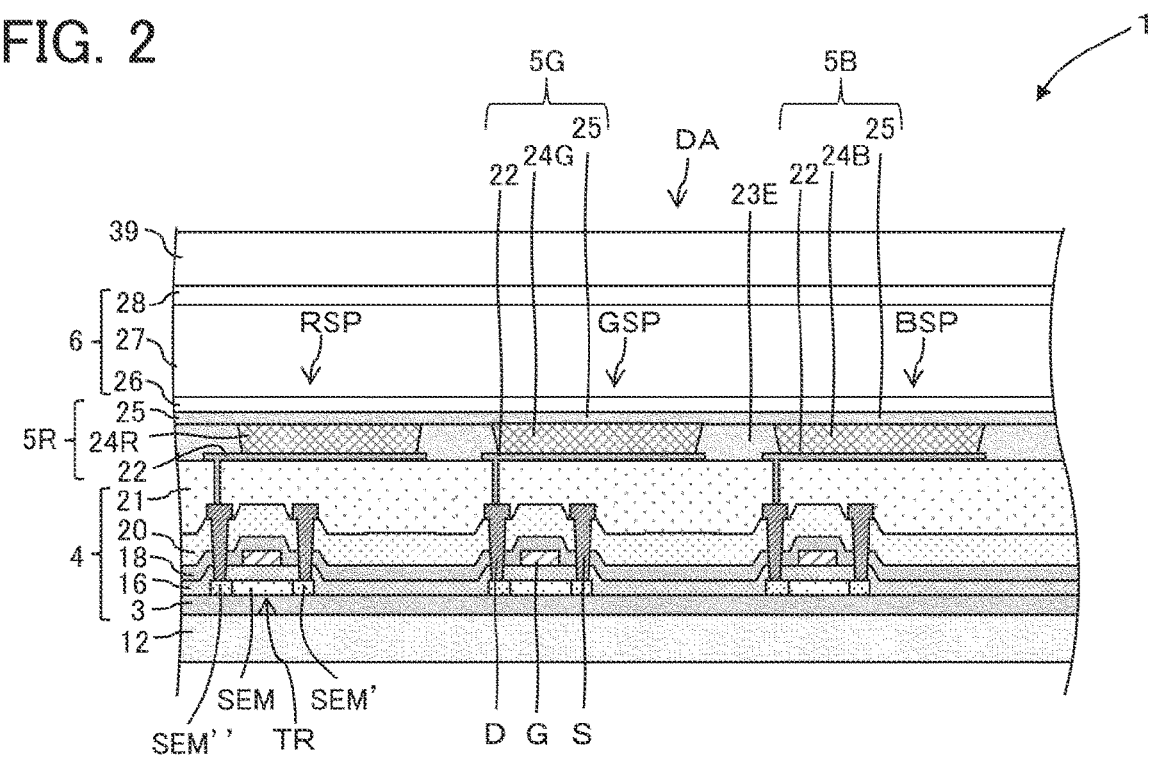
FIG. 2 is a schematic cross-sectional view of a structure of a portion A of a display area of the display device in accordance with Embodiment 1 shown in FIG. 1.

FIG. 2 is a schematic cross-sectional view of a structure of a portion A of the display area DA of the display device 1 shown in FIG. 1. Note that the entire display area DA of the display device 1 shown in FIG. 1 has the same structure as the portion A of the display area DA of the display device 1 shown in FIG. 2.

Referring to FIG. 2, the display area DA of the display device 1 includes a plurality of pixels each including a red subpixel RSP, a green subpixel GSP, and a blue subpixel BSP. Although the present embodiment discusses, as an example, a plurality of pixels each including a red subpixel RSP, a green subpixel GSP, and a blue subpixel BSP, this is not the only possible implementation of the disclosure. Alternatively, for example, each pixel may include a red subpixel RSP, a green subpixel GSP, and a blue subpixel BSP and further include a subpixel of another color.

The display device 1 includes, in the display area DA; a thin film transistor layer 4 including a barrier layer 3 and a transistor TR; red light-emitting elements 5R, green light-emitting elements 5G, blue light-emitting elements 5B, and an edge cover 23E; a sealing layer 6; and a functional film 39, all of which are provided in this order on a substrate 12 when viewed from the substrate 12. Note that the substrate 12 will be detailed later.

Referring to FIG. 2, a transistor TR portion of the thin film transistor layer 4 that contains a plurality of inorganic insulating films includes a barrier layer (first inorganic insulating film) 3, a semiconductor film SEM and doped semiconductor films SEM' and SEM", a gate insulating film (second inorganic insulating film) 16, a gate electrode G, an interlayer insulating film (third inorganic insulating film) 18, an interlayer insulating film (fourth inorganic insulating film) 20, a source electrode S and a drain electrode D, and a planarization film 21. In contrast, a portion other than the transistor TR portion of the thin film transistor layer 4 that contains a plurality of inorganic insulating films includes a barrier layer (first inorganic insulating film) 3, a gate insulating film (second inorganic insulating film) 16, an interlayer insulating film (third inorganic insulating film) 18, an interlayer insulating film (fourth inorganic insulating film) 20, and a planarization film 21.

The barrier layer 3 is a layer that prevents water, oxygen, and like foreign objects from permeating the transistor TR, the red light-emitting element 5R, the green light-emitting element 5G, and the blue light-emitting element 5B and includes, for example, a silicon oxide film, a silicon nitride film, a silicon oxynitride film, or a stack of these films prepared by CVD.

The semiconductor films SEM, SEM', and SEM" may be made of, for example, a low-temperature polysilicon (LTPS) or an oxide semiconductor (e.g., In—Ga—Zn—O-based semiconductor). Although the present embodiment discusses, as an example, the transistor TR having a top-gate structure, this is not the only possible implementation of the disclosure. Alternatively, the transistor TR may have a bottom-gate structure.

The gate electrode G, the source electrode S, and the drain electrode D are each made of, for example, metal monolayer film including at least one of aluminum, tungsten, molybdenum, tantalum, chromium, titanium, and copper or a stack of layers of two or more of these metals.

The gate insulating film 16, the interlayer insulating film 18, and the interlayer insulating film 20 each include, for example, a silicon oxide film, a silicon nitride film, a silicon oxynitride film, or a stack of these films prepared by CVD.

The planarization film 21 is made of, for example, an organic material, such as a polyimide or an acrylic, that can be provided by printing or coating technology.

Figure 3:
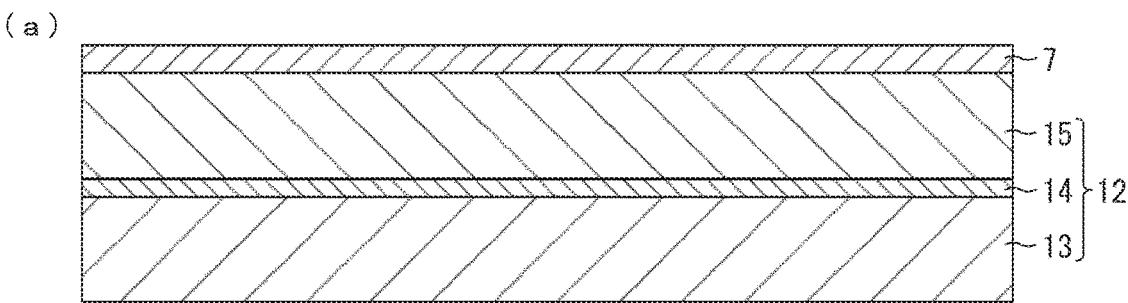
In FIG. 3, (a), (b), (c), and (d) illustrate some manufacturing steps of the display device in accordance with Embodiment 1.
Figure 3:
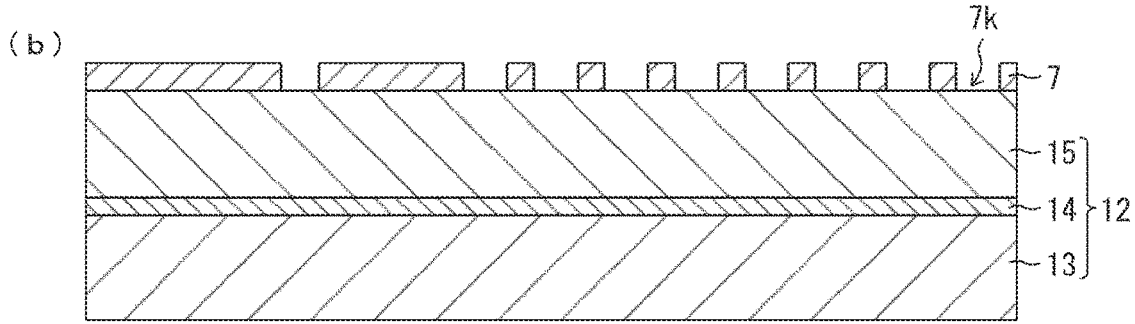
Figure 3:
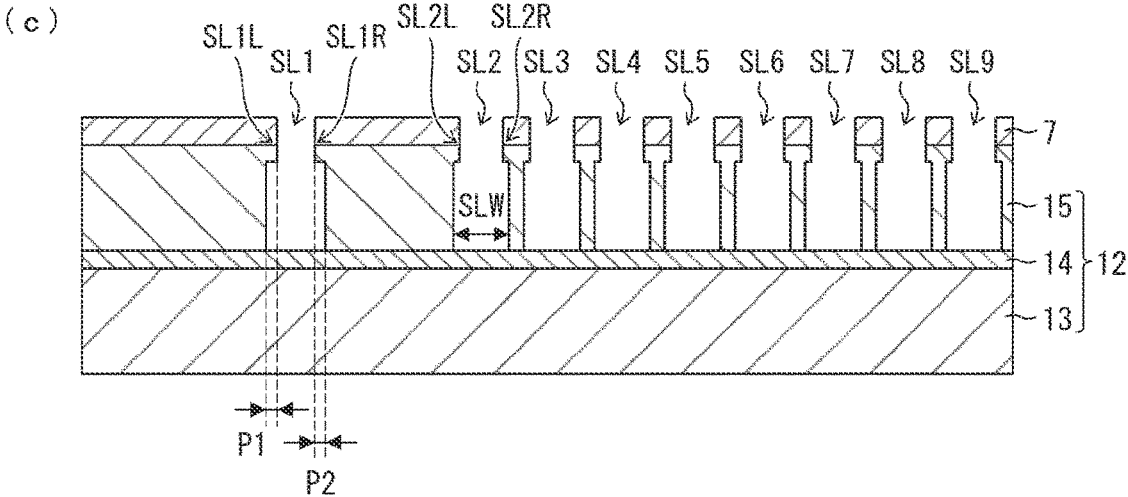
Figure 3:
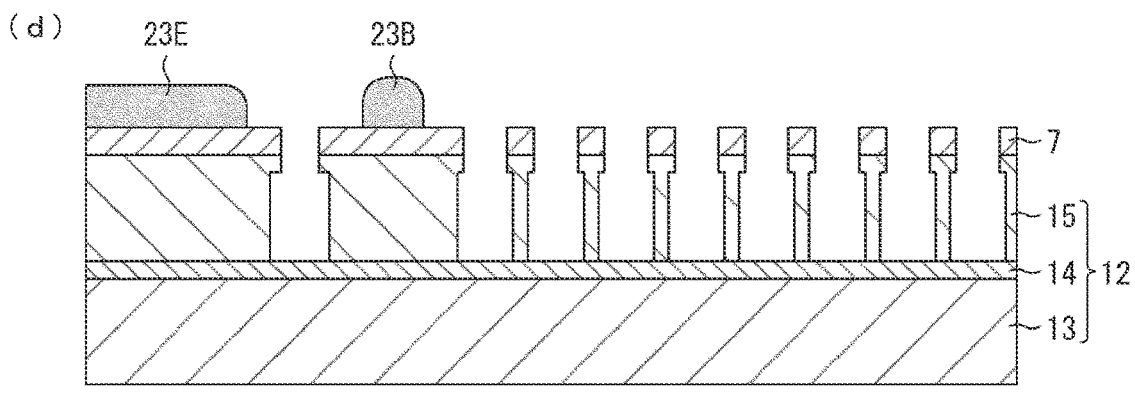
Figure 4:
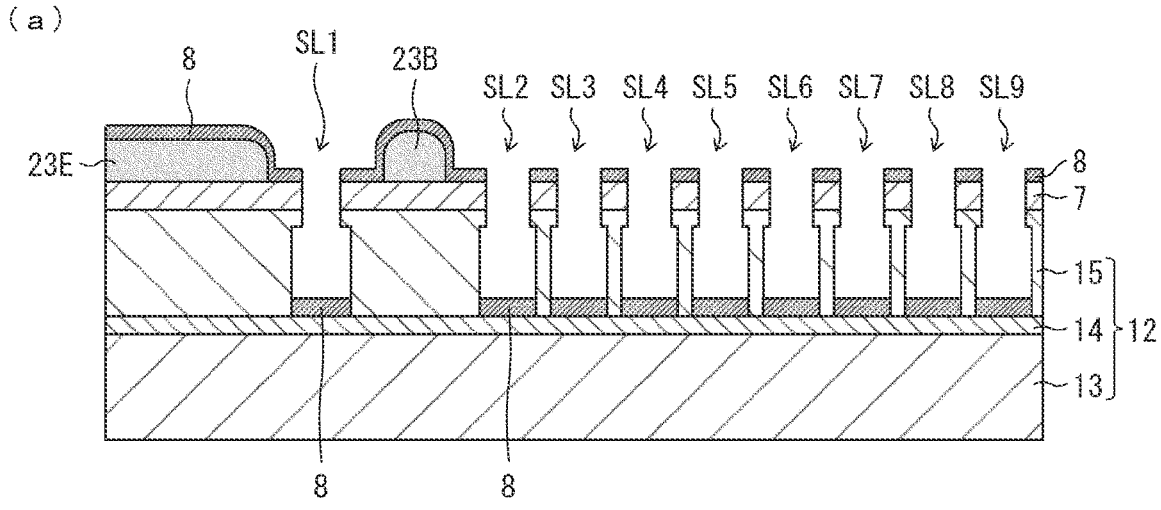
In FIG. 4, (a), (b), and (c) illustrate some of the remaining manufacturing steps of the display device in accordance with Embodiment 1.
Figure 4:
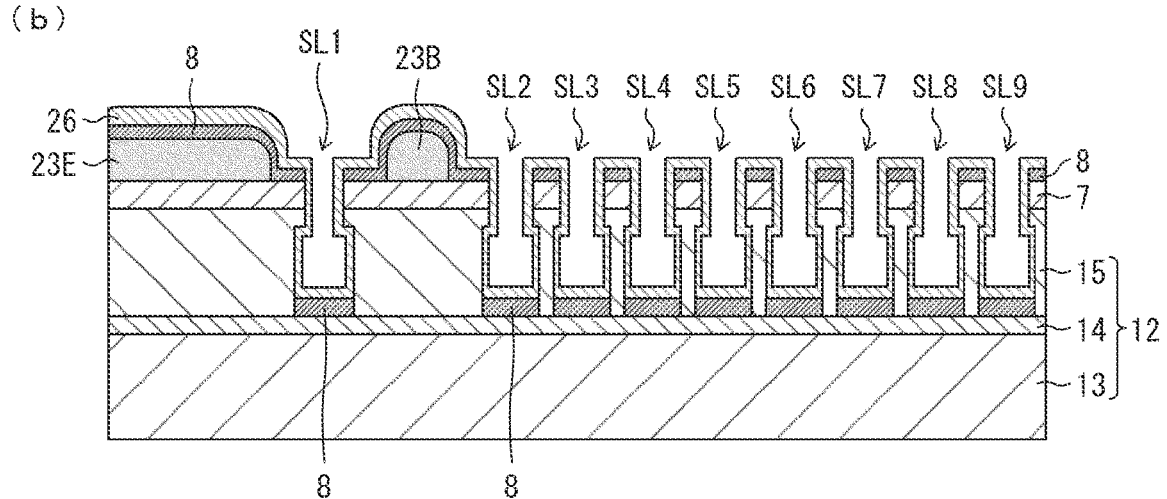
Figure 4:
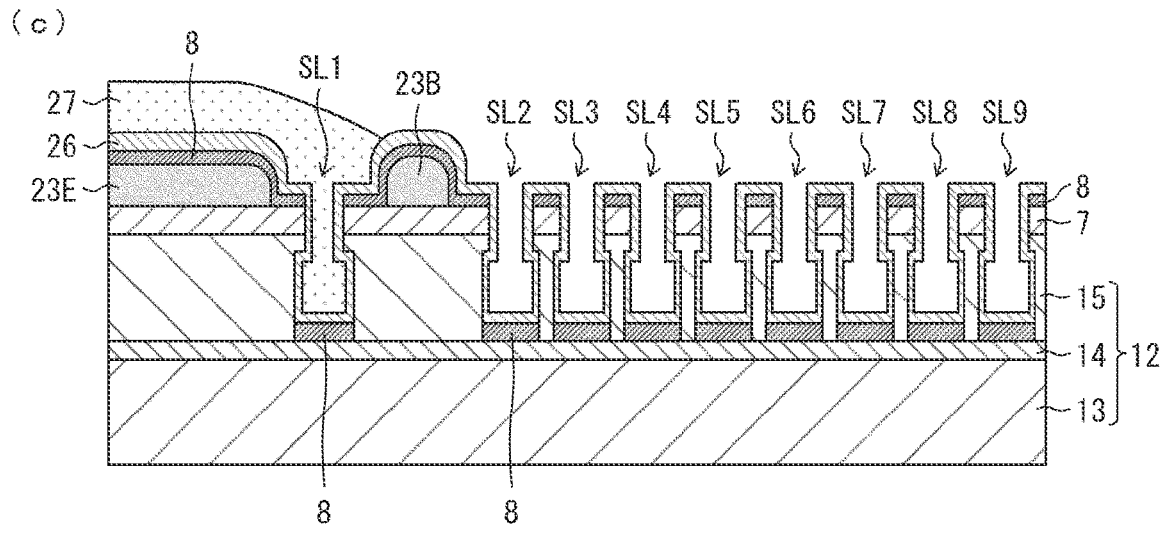
Figure 5:
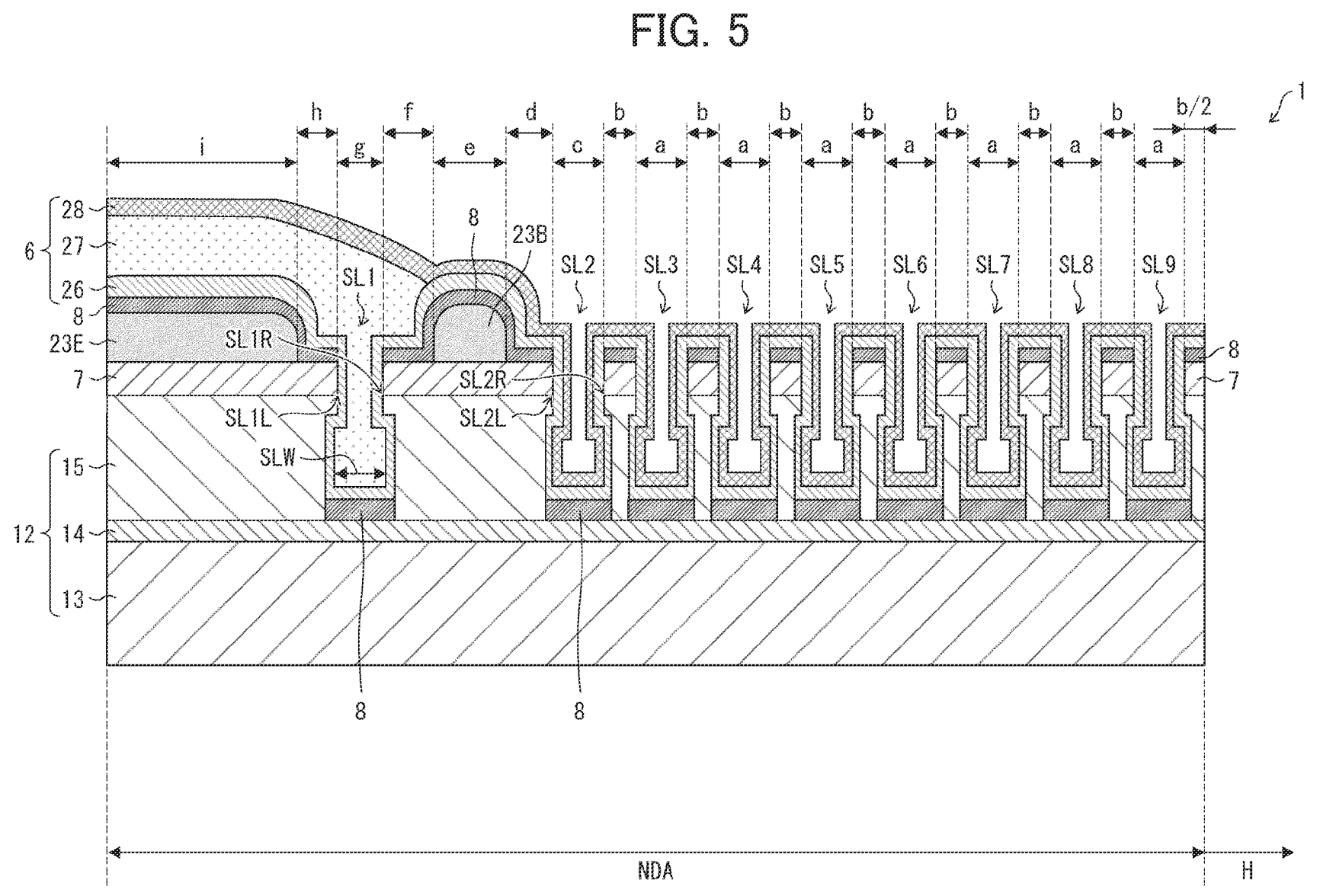

At least one of the plurality of inorganic insulating films (first to fourth inorganic insulating films) in the thin film transistor layer 4, in other words, at least one of the barrier layer 3, the gate insulating film 16, the interlayer insulating film 18, and the interlayer insulating film 20 shown in FIG. 2, is extended from the display area DA to the non-display area NDA, thereby forming an extension 7 extending from the display area DA shown in FIGS. 3, 4, and 5 detailed later.

Although the present embodiment discusses an example where the extension 7 extending from the display area DA shown in FIGS. 3, 4, and 5 is formed of the barrier layer 3, the gate insulating film 16, the interlayer insulating film 18, and the interlayer insulating film 20 shown in FIG. 2, this is not the only possible implementation of the disclosure. Alternatively, the extension 7 extending from the display area DA shown in FIGS. 3, 4, and 5 may be formed of, for example, the barrier layer 3, the gate insulating film 16, and the interlayer insulating film 18, may be formed of the barrier layer 3 and the gate insulating film 16, and may be formed only of the barrier layer 3. This is however again not the only possible implementations of the disclosure.

The red subpixel RSP in the display area DA of the display device 1 includes the red light-emitting element 5R, the green subpixel GSP in the display area DA of the display device 1 includes the green light-emitting element 5G, and the blue subpixel BSP in the display area DA of the display device 1 includes the blue light-emitting element 5B. The red light-emitting element 5R in the red subpixel RSP includes a first electrode 22 (anode), a red-light-emitting-layer-containing functional layer 24R, and a second electrode 25 (cathode). The green light-emitting element 5G in the green subpixel GSP include a first electrode 22 (anode), a green-light-emitting-layer-containing functional layer 24G, and a second electrode 25 (cathode). The blue light-emitting element 5B in the blue subpixel BSP includes a first electrode 22 (anode), a blue-light-emitting-layer-containing functional layer 24B, and a second electrode 25 (cathode). Note that the electrically insulating edge cover 23E covers the edge of the first electrode 22 (anode) and is formed by, for example, applying an organic material such as a polyimide or an acrylic and thereafter patterning the organic material by photolithography.

The red-light-emitting-layer-containing functional layer 24R can be formed by, for example, stacking a hole injection layer, a hole transport layer, a red light-emitting layer, an electron transport layer, and an electron injection layer sequentially from the first electrode 22 (anode) side. One or more of the hole injection layer, the hole transport layer, the electron transport layer, and the electron injection layer in the red-light-emitting-layer-containing functional layer 24R, other than the red light-emitting layer, may be omitted where appropriate.

The green-light-emitting-layer-containing functional layer 24G can be formed by, for example, stacking a hole injection layer, a hole transport layer, a green light-emitting layer, an electron transport layer, and an electron injection layer sequentially from the first electrode 22 (anode) side. One or more of the hole injection layer, the hole transport layer, the electron transport layer, and the electron injection layer in the green-light-emitting-layer-containing functional layer 24G, other than the green light-emitting layer, may be omitted where appropriate.

The blue-light-emitting-layer-containing functional layer 24B can be formed by, for example, stacking a hole injection layer, a hole transport layer, a blue light-emitting layer, an electron transport layer, and an electron injection layer sequentially from the first electrode 22 (anode) side. One or more of the hole injection layer, the hole transport layer, the electron transport layer, and the electron injection layer in the blue-light-emitting-layer-containing functional layer 24B, other than the blue light-emitting layer, may be omitted where appropriate.

Note that an electron blocking layer for preventing the electrons coming from the second electrode 25 (cathode) from passing through may be provided between the hole transport layer and the light-emitting layer and that the hole transport layer may be made of an electron-blocking material that prevents the electrons coming from the second electrode 25 (cathode) from passing through.

In addition, a hole blocking layer for preventing the holes coming from the first electrode 22 (anode) from passing through may be provided between the electron transport layer and the light-emitting layer and that the electron transport layer may be made of a hole blocking material that prevents the holes coming from the first electrode 22 (anode) from passing through.

Note that at least one of, for example, the hole injection layer, the hole transport layer, the light-emitting layer, the electron transport layer, and the electron injection layer described above is often formed by vapor-depositing or applying an organic material without using a vapor deposition mask that is designed in view of the through hole H.

In the present embodiment, a common hole injection layer and a common hole transport layer that are common to the red-light-emitting-layer-containing functional layer 24R, the green-light-emitting-layer-containing functional layer 24G, and the blue-light-emitting-layer-containing functional layer 24B, in other words, that are common to the red light-emitting element 5R, the green light-emitting element 5G, and the blue light-emitting element 5B, are formed to a thickness of 10.9 nm and 118.2 nm respectively. Then, the hole transport layer and the red light-emitting layer that are contained only in the red light-emitting element 5R are formed to a thickness of 91 nm and 38 nm respectively. The hole transport layer and the green light-emitting layer that are contained only in the green light-emitting element 5G are formed to a thickness of 34.7 nm and 38 nm respectively. The hole transport layer and the blue light-emitting layer that are contained only in the blue light-emitting element 5B are formed to a thickness of 10.9 nm and 17.2 nm respectively. Then, a common hole blocking layer, a common electron transport layer, and a common electron injection layer that are common to the red-light-emitting-layer-containing functional layer 24R, the green-light-emitting-layer-containing functional layer 24G, and the blue-light-emitting-layer-containing functional layer 24B are formed to a thickness of 5.4 nm, 27.2 nm, and 1 nm respectively. This is however not the only possible implementation of the disclosure. For example, in each of the red-light-emitting-layercontaining functional layer 24R, the green-light-emitting-layer-containing functional layer 24G, and the blue-light-emitting-layer-containing functional layer 24B, all the layers (e.g., the hole injection layer, the hole transport layer, the electron transport layer, and the electron injection layer), except for the red light-emitting layer, the green light-emitting layer, and the blue light-emitting layer, may be formed as common layers.

In addition, for example, the hole injection layers in the functional layers 24R, 24G, and 24B may be made of different materials. For example, the hole injection layers in two of the functional layers 24R, 24G, and 24B may be formed of the same material in the same step, whereas only the hole injection layer in the remaining one of the functional layers may be formed of a different material in a different step. Additionally, for example, the hole transport layers in the functional layers 24R, 24G, and 24B may be made of different materials. For example, the hole transport layers in two of the functional layers 24R, 24G, and 24B may be formed of the same material in the same step, whereas only the hole transport layer in the remaining one of the functional layers may be formed of a different material in a different step. Furthermore, for example, the electron transport layers in the functional layers 24R, 24G, and 24B may be made of different materials. For example, the electron transport layers in two of the functional layers 24R, 24G, and 24B may be formed of the same material in the same step, whereas only the electron transport layer in the remaining one of the functional layers may be formed of a different material in a different step. Furthermore, for example, the electron injection layers in the functional layers 24R, 24G, and 24B may be made of different materials. For example, the electron injection layers in two of the functional layers 24R, 24G, and 24B may be formed of the same material in the same step, whereas only the electron injection layer in the remaining one of the functional layers may be formed of a different material in a different step.

Although the present embodiment discusses, as an example, the red light-emitting elements 5R, the green light-emitting elements 5G, and the blue light-emitting elements 5B being all OLEDs (organic light-emitting diodes), this is not the only possible implementation of the disclosure. Alternatively, the red light-emitting elements 5R, the green light-emitting elements 5G, and the blue light-emitting elements 5B may be QLEDs (quantum-dot light-emitting diodes). As a further alternative, some of the red light-emitting elements 5R, the green light-emitting elements 5G, and the blue light-emitting elements 5B may be OLEDs, and some of the rest of the red light-emitting elements 5R, the green light-emitting elements 5G, and the blue light-emitting elements 5B may be QLEDs. When the red light-emitting elements 5R, the green light-emitting elements 5G, and the blue light-emitting elements 5B are OLEDs, the light-emitting layers in the light-emitting elements of each color are, for example, organic light-emitting layers formed by vapor deposition. When the red light-emitting elements 5R, the green light-emitting elements 5G, and the blue light-emitting elements 5B are QLEDs, the light-emitting layers in the light-emitting elements of each color are, for example, light-emitting layers containing quantum dots formed by coating or inkjet printing.

Each of the red subpixels RSP, the green subpixels GSP, and the blue subpixels BSP includes, in the thin film transistor layer 4 containing the transistor TR, a control circuit including the transistor TR for controlling that one of the red light-emitting elements 5R, the green light-emitting elements 5G, and the blue light-emitting elements 5B respectively. Note that the light-emitting element and the control circuit including the transistor TR, provided for each of the red subpixels RSP, the green subpixels GSP, and the blue subpixels BSP, may be collectively referred to as a subpixel circuit.

The red light-emitting elements 5R, the green light-emitting elements 5G, and the blue light-emitting elements 5B shown in FIG. 2 may be either of a top-emission type or of a bottom-emission type. Since the red light-emitting elements 5R, the green light-emitting elements 5G, and the blue light-emitting elements 5B have a forward-order stack structure in which the first electrode 22 (anode), the functional layers 24R, 24G, and 24B, and the second electrode 25 (cathode) are provided in this order when viewed from the substrate 12, the second electrode 25 (cathode) is arranged to overlie the first electrode 22 (anode). Therefore, to obtain a top-emission type, the first electrode 22 (anode) needs only to be made of an electrode material that reflects visible light, and the second electrode 25 (cathode) needs only to be made of an electrode material that transmits visible light. To obtain a bottom-emission type, the first electrode 22 (anode) needs only to be made of an electrode material that transmits visible light, and the second electrode 25 (cathode) needs only to be made of an electrode material that reflects visible light.

The red light-emitting elements 5R, the green light-emitting elements 5G, and the blue light-emitting elements 5B may have a reverse-order stack structure in which the first electrode 22 (cathode), the functional layers 24R, 24G, and 24B (the electron injection layer, the electron transport layer, the light-emitting layer, the hole transport layer, and the hole injection layer are stacked sequentially from the first electrode 22 (cathode) side), and the second electrode 25 (anode) are provided in this order when viewed from the substrate 12. In the reverse-order stack structure, the second electrode 25 (anode) is arranged to overlie the first electrode 22 (cathode). Therefore, to obtain a top-emission type, the first electrode 22 (cathode) needs only to be made of an electrode material that reflects visible light, and the second electrode 25 (anode) needs only to be made of an electrode material that transmits visible light. To obtain a bottom-emission type, the first electrode 22 (cathode) needs only to be made of an electrode material that transmits visible light, and the second electrode 25 (anode) needs only to be made of an electrode material that reflects visible light.

Although the present embodiment discusses, as an example, the first electrode 22 (anode) being formed of an electrode material that reflects visible light to a thickness of 20 nm, this is not the only possible implementation of the disclosure. Additionally, although the present embodiment discusses, as an example, the second electrode 25 (cathode) being formed of an electrode material that transmits visible light to a thickness of 20 nm, this is not the only possible implementation of the disclosure.

The electrode material that reflects visible light is not limited in any particular manner so long as the material reflects visible light and conducts an electric current. Examples of the material include metal materials such as Al, Mg, Li, and Ag; alloys of any of these metal materials; stacks of the metal materials and transparent metal oxides (e.g., indium tin oxide, indium zinc oxide, and indium gallium zinc oxide); and stacks of the alloys and the transparent metal oxides.

Meanwhile, the electrode material that transmits visible light is not limited in any particular manner so long as the material transmits visible light and conducts an electric current. Examples of the material include transparent metal oxides (e.g., indium tin oxide, indium zinc oxide, and indium gallium zinc oxide); and thin films of metal materials such as Al, Mg, Li, and Ag.

The first electrode 22 and the second electrode 25 can be formed by a common electrode-forming method including a physical vapor deposition (PVD) such as vacuum vapor deposition, sputtering, or EB vapor deposition, or ions plating or chemical vapor deposition (CVD). Additionally, the first electrode 22 and the second electrode 25 can be patterned by any method so long as the method is capable of forming a desirable pattern with high precision. Specific examples of the method include photolithography and inkjet printing.

The sealing layer 6 is translucent and can be formed by, for example: a first inorganic sealing film 26 covering the second electrode 25; an organic sealing film 27 overlying the first inorganic sealing film 26; and a second inorganic sealing film 28 overlying the organic sealing film 27. The sealing layer 6 prevents water, oxygen, and like foreign objects from permeating the red light-emitting elements 5R, the green light-emitting elements 5G, and the blue light-emitting elements 5B.

The first inorganic sealing film 26 and the second inorganic sealing film 28 are inorganic films and formed by, for example, a silicon oxide film, a silicon nitride film, or a silicon oxynitride film, or a stack of these films, all of which can be prepared by CVD. The organic sealing film 27 is a translucent organic film that has a planarization effect and can be formed by, for example, an organic material, such as an acrylic, that can be provided by printing or coating technology. The organic sealing film 27 may be formed by, for example, inkjet printing. Although the present embodiment discusses, as an example, the sealing layer 6 being formed by a single organic film provided between two inorganic films and two inorganic films, this is not the only possible order of stacking of the two inorganic films and the single organic film. Furthermore, the sealing layer 6 may be formed only by an inorganic film, by a single inorganic film and two organic films, or by two or more inorganic films and two or more organic films. Note that although the present embodiment discusses, as an example, the first inorganic sealing film 26 being formed to a thickness of 80 nm and the second inorganic sealing film 28 being formed to a thickness of 13.1 nm, this is not the only possible implementation of the disclosure.

The functional film 39 has at least one of, for example, an optical compensation function, a touch sensor function, and a protection function.

Figure 12:
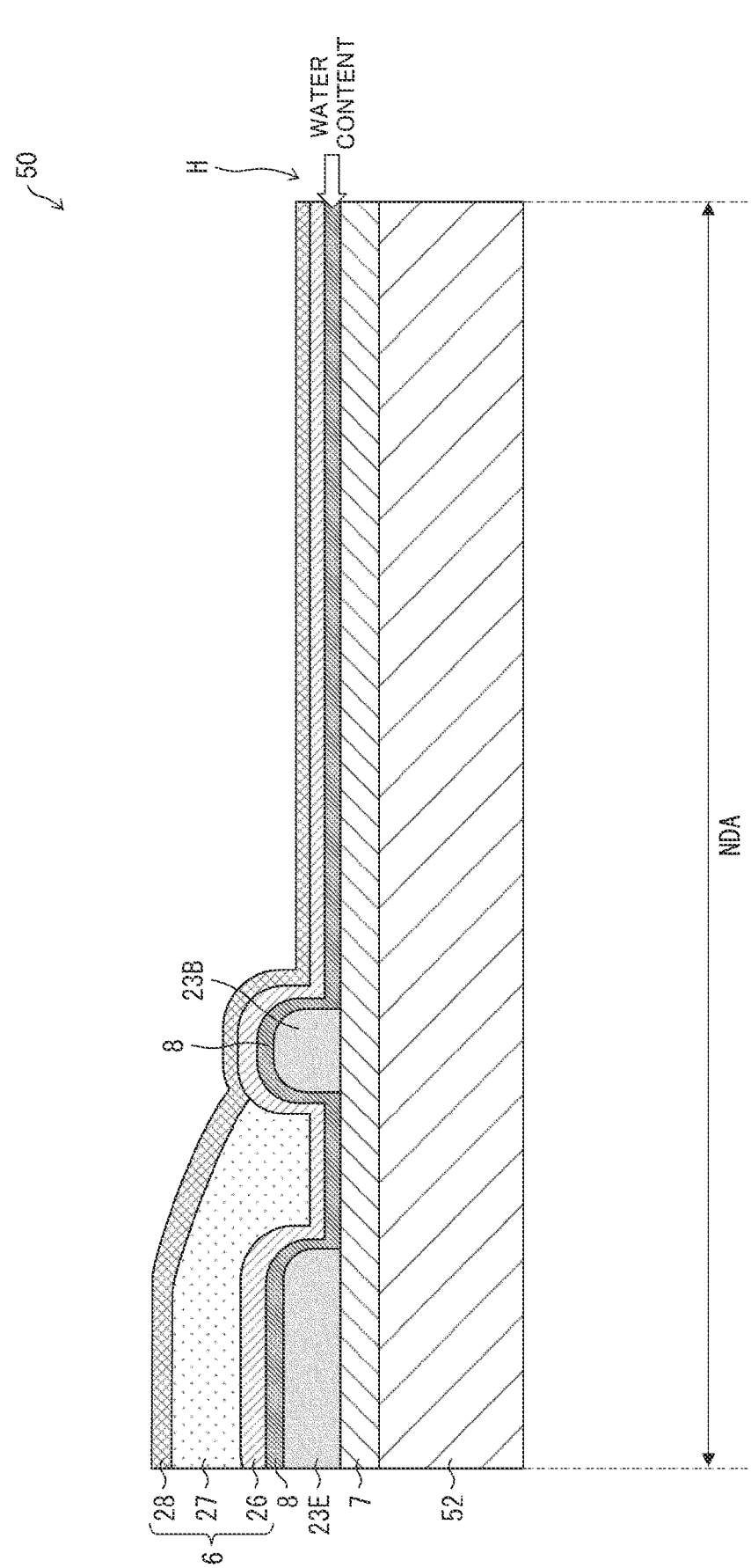
FIG. 12 illustrates why reliability cannot be ensured of a display device that is complete with a through hole in accordance with a comparative example.

FIG. 12 illustrates why reliability cannot be ensured of a display device 50 that is complete with a through hole H in accordance with a comparative example.

Referring to FIG. 12, the display device 50 is provided with the through hole (imaging aperture) H and includes, in the non-display area NDA of the display device 50, an extension 7 extending from the display area DA on a substrate 52. Note that the substrate 52 includes a resin substrate and further includes an intermediate layer (inorganic film) and a resin layer both of which are provided on the resin substrate in this order when viewed from the resin substrate. The resin layer is flat.

The extension 7 extending from the display area DA, as described earlier, is an extension from the display area DA to the non-display area NDA of at least one of the plurality of inorganic insulating films (first to fourth inorganic insulating films) in the thin film transistor layer 4, in other words, at least one of the barrier layer 3, the gate insulating film 16, the interlayer insulating film 18, and the interlayer insulating film 20 shown in FIG. 2.

The edge cover 23E (described earlier) and a bank 23B are provided in, for example, the same step on the extension 7 extending from the display area DA. Note that the bank 23B is, for example, a bank for stopping spreading of the organic sealing film 27 formed by inkjet printing.

When, in this manner, the functional layer 24R, 24G, or 24B including the light-emitting layer shown in FIG. 2, in other words, for example, at least one of the hole injection layer, the hole transport layer, the light-emitting layer, the electron transport layer, and the electron injection layer, is formed by vapor-depositing an organic material without using a vapor deposition mask that is designed in view of the through hole H after the manufacturing process is completed up to the formation of the edge cover 23E and the bank 23B, a vapor-deposited organic film 8 forms a continuous film of the organic material around the through hole H from the display area DA to a face where the through hole H is provided as shown in FIG. 12. Additionally, when at least one of the hole injection layer, the hole transport layer, the light-emitting layer, the electron transport layer, and the electron injection layer is formed by applying an organic material, the organic film 8 formed by the application similarly forms a continuous film of the organic material around the through hole H from the display area DA to a face where the through hole His provided.

Then, as shown in FIG. 2, after the second electrode 25 is formed in the display area DA, the first inorganic sealing film 26 is formed in the display area DA and the non-display area NDA, the organic sealing film 27 is formed inside the bank 23B of the non-display area NDA and in the display area DA, and the second inorganic sealing film 28 is formed in the display area DA and the non-display area NDA, which completes the manufacture of the display device 50 in accordance with the comparative example.

However, in the display device 50, as shown in FIG. 12, for example, the water content having permeated through the face where the through hole H is provided can have adverse effects on the light-emitting elements 5R, 5G, and 5B in the display area DA via the continuous film 8 of an organic material formed from the face where the through hole H is provided to the display area DA, thereby disadvantageously degrading the reliability of the display device 50.

Accordingly, the display device 1 in accordance with the present embodiment has slits SL1 to SL9 to restrain the organic film 8 described above from being formed as a continuous film from the face where the through hole H is provided to the display area DA.

Portions (a) of FIG. 3, (b) of FIG. 3, (c) of FIG. 3, and (d) of FIG. 3 illustrate some manufacturing steps of the display device 1 in accordance with Embodiment 1.

Portions (a) of FIG. 4, (b) of FIG. 4, and (c) of FIG. 4 illustrate some of the remaining manufacturing steps of the display device 1 in accordance with Embodiment 1.

FIG. 5 is a schematic cross-sectional view of a structure of the non-display area NDA and the through hole H of the display device 1 in accordance with Embodiment 1.

Figure 6:
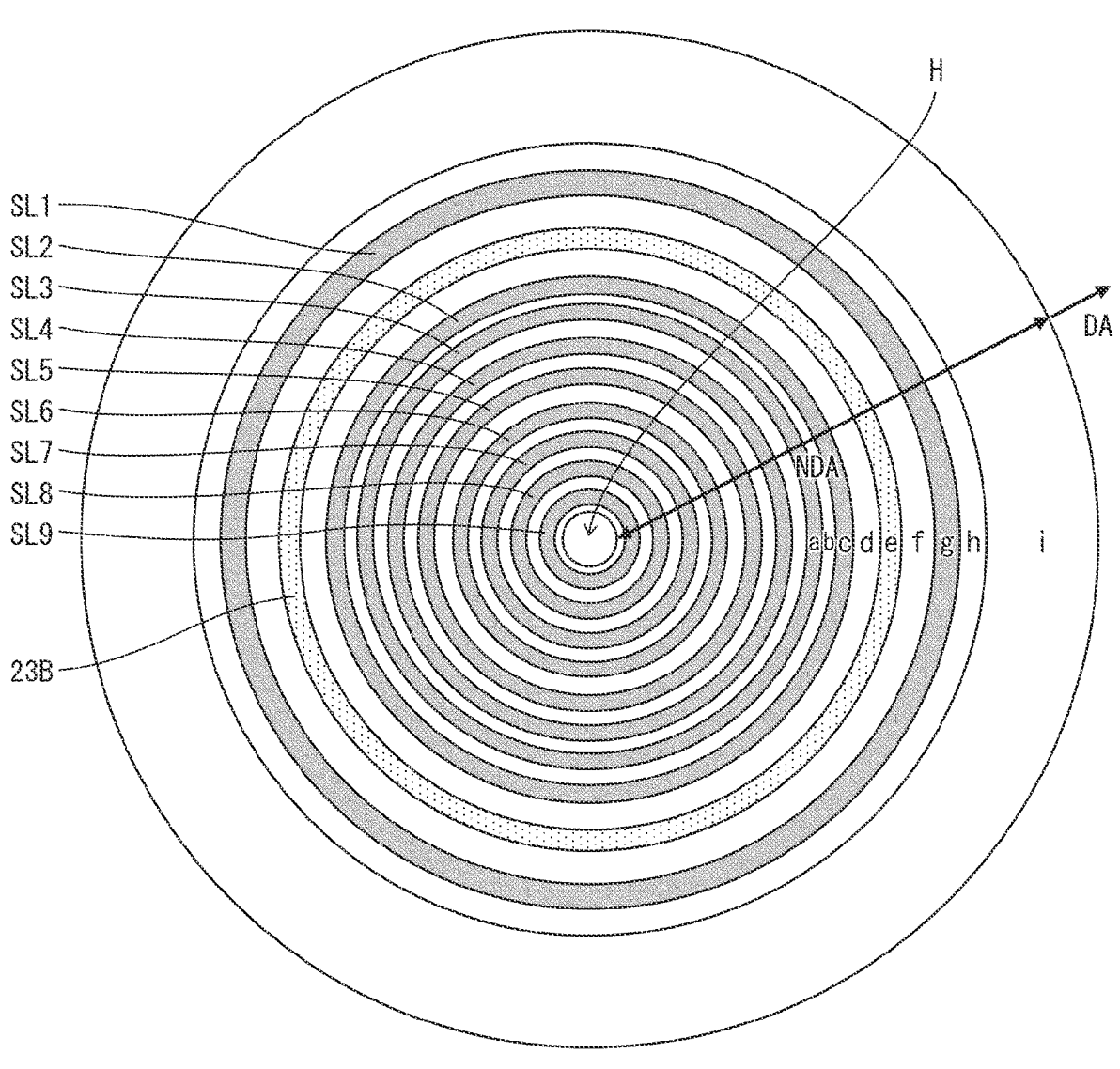
FIG. 6 is a plan view of the through hole and slits in the display device in accordance with Embodiment 1.

FIG. 6 is a plan view of the through hole H and the slits SL1 to SL9 in the display device 1 in accordance with Embodiment 1.

Figure 7:
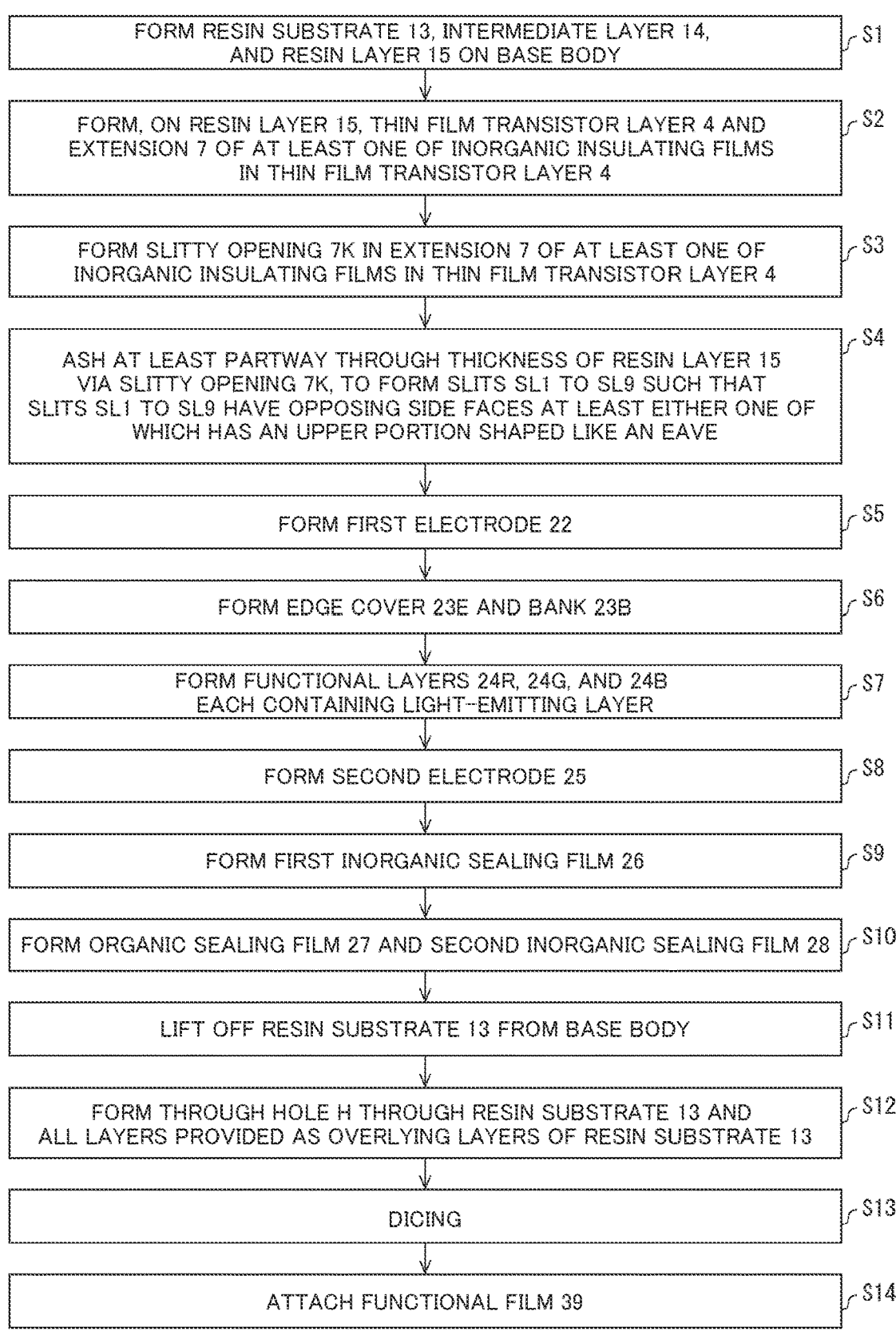
FIG. 7 is a diagram representing manufacturing steps of the display device in accordance with Embodiment 1.

FIG. 7 is a diagram representing manufacturing steps of the display device 1 in accordance with Embodiment 1.

Referring to FIG. 7, a method of manufacturing the display device 1 involves a step (S1) of forming a resin substrate 13, an intermediate layer 14, and a resin layer 15 on a base body. This step S1 includes a step of forming the resin substrate 13 on the base body, a step of forming the intermediate layer 14 from an inorganic film on the resin substrate 13, and a step of forming the resin layer 15 on the intermediate layer 14. As shown in FIG. 2 and (a) of FIG. 3, in the display area DA and the non-display area NDA of the display device 1, the substrate 12 is provided on the base body (not shown). Although the present embodiment uses a glass substrate as the base body, the base body may be made of any substance so long as the base body can be lifted off and removed from the substrate 12. Note that as shown in (a) of FIG. 3, the substrate 12 includes the resin substrate 13 on the base body (not shown) side and also includes the intermediate layer 14 and the resin layer (inorganic film) 15 on the resin substrate 13, both of which are provided in this order when viewed from the resin substrate 13. Although the present embodiment discusses, as an example, the substrate 12 including: the resin substrate 13 made of a resin material such as a polyimide; the intermediate layer 14 made of an inorganic film of, for example, a silicon oxide and provided on the resin substrate 13; and the resin layer 15 made of a resin material such as a polyimide and provided on the intermediate layer 14, this is not the only possible implementation of the disclosure. Alternatively, the substrate 12 may be made only of, for example, a resin material such as a polyimide, in other words, only of the resin layer 15.

Thereafter, in a step of forming, on the resin layer 15, the thin film transistor layer 4 and the extension 7 formed by extending at least one of the plurality of inorganic insulating films included in the thin film transistor layer 4 (step S2 shown in FIG. 7), the thin film transistor layer 4 is formed on the resin layer 15 of the substrate 12 in the display area DA of the display device 1 as shown in FIG. 2, and the extension 7 at least one of the plurality of inorganic insulating films (first to fourth inorganic insulating films) included in the thin film transistor layer 4 in the display area DA is formed on the resin layer 15 of the substrate 12 in the non-display area NDA of the display device 1 as shown in (a) of FIG. 3.

Then, in a step of forming slitty openings 7k in the extension 7 formed by extending at least one of the plurality of inorganic insulating films included in the thin film transistor layer 4 (step S3 shown in FIG. 7), the slitty openings 7k are formed in the extension 7 formed by extending at least one of the plurality of inorganic insulating films (first to fourth inorganic insulating films) included in the thin film transistor layer 4 in the non-display area NDA of the display device 1 as shown in (b) of FIG. 3. Note that in the step of forming the slitty openings 7k in the extension 7 formed by extending at least one of the plurality of inorganic insulating films (first to fourth inorganic insulating films), the slitty openings 7k can be formed in the extension 7 with high precision by, for example, dry etching.

Thereafter, in a step of forming the slits SL1 to SL9 (step S4 shown in FIG. 7), the resin layer 15 is subjected to ashing at least partway through the thickness thereof through the slitty openings 7k, thereby forming the slits SL1 to SL9 and imparting an eave-like shape to an upper portion of at least either one of the opposing side faces of the slits SL1 to SL9. Note that each of the slits SL1 to SL9 has the above-described slitty opening 7k shown in (b) of FIG. 3. In this step S4, the resin layer 15 is subjected to ashing at least partway through the thickness thereof by using as a mask the extension 7 formed by extending at least one of the plurality of inorganic insulating films. In the present embodiment, the upper portion of at least either one of the two opposing side faces of the slits SL1 to SL9 including at least one of the plurality of inorganic insulating films (extension 7) and a part of the resin layer 15 (e.g., slit upper portions SL1L, SL1R, SL2L, and SL2R) is shaped like an eave protruding toward the other side face of the slits SL1 to SL9 as shown in (c) of FIG. 3. For example, the upper portion SL1L of the left-hand side face in the drawing of the slit SL1 can be shaped like an eave so as to protrude in a slit width direction SLW (left and right direction in the drawing) from a portion other than the upper portion SL1L of the left-hand side face in the drawing of the slit SL1, by side-etching the resin layer 15 by anisotropic etching in dry ashing using, for example, gaseous oxygen. Note that an eave length P1 is defined as a maximum of the length by which the upper portion SL1L of one of the side faces of the slit SL1 protrudes in the slit width direction SLW from the portion other than the upper portion SL1L of one of the side faces of the slit SL1. Similarly, the upper portion SL1R of the right-hand side face in the drawing of the slit SL1 can be shaped like an eave so as to protrude in the slit width direction SLW (left and right direction in the drawing) from a portion other than the upper portion SL1R of the right-hand side face in the drawing of the slit SL1, by side-etching the resin layer 15. Note that an eave length P2 is defined as a maximum of the length by which the upper portion SL1R of one of the side faces of the slit SL1 protrudes in the slit width direction SLW from the portion other than the upper portion SL1R of one of the side faces of the slit SL1. Note that the lengths of the eave length P1 and the eave length P2 are not limited in any particular manner and are preferably from 1.2 μm to 2.4 μm, both inclusive. When the lengths of the eave length P1 and the eave length P2 are from 1.2 μm to 2.4 μm, both inclusive, the above-described organic film 8 can be restrained from being formed as a continuous film from the face where the through hole H is provided to the display area DA, and the first inorganic sealing film 26 can be formed as a continuous film in the display area DA and the non-display area NDA.

Although in relation to the display device 1 in accordance with the present embodiment, the description has so far discussed an example where for each of the slits SL2 to SL9, as well as for the slit SL1, an upper portion of the left-hand side face in the drawing of the slits SL2 to SL9 is shaped like an eave so as to protrude in the slit width direction SLW (left and right direction in the drawing) from a portion other than the upper portion of the left-hand side face in the drawing of the slits SL2 to SL9, and an upper portion of the right-hand side face in the drawing of the slits SL2 to SL9 is shaped like an eave so as to protrude in the slit width direction SLW (left and right direction in the drawing) from a portion other than the upper portion of the right-hand side face in the drawing of the slits SL2 to SL9, as shown in (c) of FIG. 3, this is not the only possible implementation of the disclosure. Alternatively, for example, the upper portion of either the left-hand side face or the right-hand side face in the drawing of any one of the slits SL1 to SL9 needs only to be shaped like an eave protruding toward the other side face of that slit. When either the left- or right-hand side face in the drawing of any one of the slits SL1 to SL9 is formed in an eave-like shape, in other words, in a reverse-tapered shape, the organic film 8 formed by vapor deposition or coating can be restrained from forming a continuous film of an organic material from the display area DA to the face where the through hole H is provided around the through hole H.

In addition, although in relation to the display device 1 in accordance with the present embodiment, the description has so far discussed an example where the slits SL1 to SL9 are formed to run through the resin layer 15, this is not the only possible implementation of the disclosure. Alternatively, the slits SL1 to SL9 may be formed in a part of the resin layer 15.

Thereafter, in a step of forming the first electrode 22 (step S5 shown in FIG. 7), a plurality of first electrodes 22 are formed on the planarization film 21 in the thin film transistor layer 4 in the display area DA of the display device 1 as shown in FIG. 2.

Then, in a step of forming the edge cover 23E and the bank 23B (step S6 shown in FIG. 7), the edge cover 23E and the bank 23B are formed in the display area DA and the non-display area NDA of the display device 1 as shown in FIG. 2 and (d) of FIG. 3.

Then, in a step of forming the functional layers 24R, 24G, and 24B containing a light-emitting layer (step S7 shown in FIG. 7), the functional layers 24R each containing a light-emitting layer are formed respectively on the first electrodes 22 included in the red subpixels RSP of the display device 1, the functional layers 24G each containing a light-emitting layer are formed respectively on the first electrodes 22 included in the green subpixels GSP of the display device 1, and the functional layers 24B each containing a light-emitting layer are formed respectively on the first electrodes 22 included in the blue subpixels BSP of the display device 1, as shown in FIG. 2. Note that the red light-emitting layers in the functional layers 24R, the green light-emitting layers in the functional layers 24G, and the blue light-emitting layers in the functional layers 24B are formed in different steps. Additionally, as described earlier, the hole injection layers in the functional layers 24R, the hole injection layers in the functional layers 24G, and the hole injection layers in the functional layers 24B are formed of the same material in the same step. The hole transport layers in the functional layers 24R, the hole transport layers in the functional layers 24G, and the hole transport layers in the functional layers 24B are formed of the same material in the same step. The electron transport layers in the functional layers 24R, the electron transport layers in the functional layers 24G, and the electron transport layers in the functional layers 24B are formed of the same material in the same step. The electron injection layers in the functional layers 24R, the electron injection layers in the functional layers 24G, and the electron injection layers in the functional layers 24B are formed of the same material in the same step.

As described in the foregoing, when the functional layers 24R, 24G, and 24B each containing a light-emitting layer are formed in the display area DA of the display device 1, these layers are formed as the organic films 8 in the non-display area NDA of the display device 1 as shown in (a) of FIG. 4. The organic film 8 includes, for example, a hole injection layer, a hole transport layer, an electron transport layer, and an electron injection layer, all of which are formed as a common layer, in the red subpixels RSP, the green subpixels GSP, and the blue subpixels BSP in the display device 1.

In the non-display area NDA of the display device 1, since the left- and right-hand side faces in the drawing of the slits SL1 to SL9 are formed in an eave-like shape, in other words, in a reverse-tapered shape, as shown in (a) of FIG. 4, the organic film 8 formed by vapor deposition or coating can be restrained from being formed as a continuous film.

As described in the foregoing, in the display device 1, since the slitty openings 7*k* formed in the extension 7 with high precision are parts of the eave-shaped side faces of the slits SL1 to SL9, the eave-shaped side faces can be formed with high precision. In contrast, when, for example, slitty openings are formed with high precision in the barrier layer

3 (first inorganic insulating film) which is the lowest one of the plurality of inorganic insulating films (first to fourth inorganic insulating films), and thereafter slits including the eave-shaped portions are formed via these slitty openings, and then the side faces of the slits are covered using at least one of the layers in the plurality of inorganic insulating films (second to fourth inorganic insulating films) overlying the barrier layer 3 (first inorganic insulating film), the eave-shaped portions of the side faces of the slits cannot be formed with high precision because, for example, the shape and eave length can be changed by at least one of the layers in the plurality of inorganic insulating films (second to fourth inorganic insulating films). Therefore, In such cases, the organic film 8 could be undesirably formed as a continuous film.

Thereafter, in step of forming the second electrode 25 (step S8 shown in FIG. 7), as shown in FIG. 2, the second electrode 25 is formed in the display area DA of the display device 1.

Then, in the step of forming the first inorganic sealing film 26 (step S9 shown in FIG. 7), as shown in FIG. 2 and (b) of FIG. 4, the first inorganic sealing film 26 is formed in the display area DA and the non-display area NDA of the display device 1. As shown in (b) of FIG. 4, the extension 7 that is at least one of the plurality of inorganic insulating films (first to fourth inorganic insulating films) formed in an eave-like shape is, in the slits SL1 to SL9, in direct contact with the first inorganic sealing film 26 covering the display area DA and the non-display area NDA including the slits SL1 to SL9.

Thereafter, in the step of forming the organic sealing film 27 and the second inorganic sealing film 28 (step S10 shown in FIG. 7), as shown in FIG. 2 and (c) of FIG. 4, the organic sealing film 27 and the second inorganic sealing film 28 are formed in the display area DA and the non-display area NDA of the display device 1. In the present embodiment, the organic sealing film 27 is formed by inkjet printing, and the organic sealing film 27 is provided on the first inorganic sealing film 26 in the display area DA and a first region of the non-display area NDA that is continuous with the display area DA as shown in FIG. 2 and (c) of FIG. 4. Note that the first region of the non-display area NDA is a region between an edge of the display area DA and the bank 23B. As shown in (c) of FIG. 4, the slit SL1, provided in the first region of the non-display area NDA, is filled by the organic sealing film 27. As shown in FIG. 5, the second inorganic sealing film 28 is provided on the organic sealing film 27 in the display area DA and the first region of the non-display area NDA and on the first inorganic sealing film 26 in a second region that is a part of the non-display area NDA other than the first region.

Thereafter, in the step of lifting off the resin substrate 13 from the base body (step S11 shown in FIG. 7), the glass substrate, which is the base body, is lifted off the resin substrate 13 by laser lift-off step (LLO step).

Then, in the step of forming the through hole H that runs through the resin substrate 13 and all the layers provided as the overlying layers of the resin substrate 13 (step S12 shown in FIG. 7), as shown in FIGS. 1 and 5, the through hole H that is a hole for directing light from the subject to the imaging element CA (camera) is formed. In other words, in the step of forming the through hole H, the through hole H that runs through the resin substrate 13 and all the layers provided as the overlying layers of the resin substrate 13 is formed so as to be adjacent to the thin film transistor layer 4 with the slits SL1 to SL9 being interposed therebetween, the resin substrate 13 and all the layers provided as the overlying layers of the resin substrate 13 being the extension 7 of at least one of the plurality of inorganic insulating films.

Since the through hole H is provided in the non-display area NDA, the non-display area NDA including the slits SL1 to SL9 is disposed between the through hole H and the display area DA in the display device 1 as shown in FIG. 6. Since the through hole H is surrounded by the plurality of circular slits SL1 to SL9, and the side faces of the slits SL1 to SL9 have an eave-like shape, in other words, a reverse-tapered shape, the organic film 8 formed by vapor deposition or coating around the through hole H is not formed as a continuous film. Note that as shown in FIG. 6, the bank 23B for stopping spreading of the organic sealing film 27 is also formed circular similarly to the plurality of slits SL1 to SL9.

Note that although the present embodiment discusses an example where the width in the left and right direction in the drawing of the bank 23B (width e in FIG. 5) is 37.4 μm, the width in the left and right direction in the drawing between the bank 23B and the through hole H (width b/2+7×width a+7×width b+width c+width d in FIG. 5) is 190 μm, and the radius of the through hole His 1850 μm, this is not the only possible implementation of the disclosure.

In addition, in the present embodiment, the gap between the eave-shaped, upper portion SL1L of the slit SL1 and the eave-shaped, upper portion SL1R of the slit SL1 is equal to width g, the gap between the eave-shaped, upper portion SL2L of the slit SL2 and the eave-shaped, upper portion SL2R of the slit SL2 is equal to width c, and the gaps between the eave-shaped, upper left portions of the slits SL3 to SL9 and the eave-shaped, upper right portions of the slits SL3 to SL9 are equal to width a. Width g, width c, and width a may have either different values or an equal value.

In addition, in the present embodiment, as shown in FIG. 5, the gap between the right-hand edge in the drawing of the bank 23B and the eave-shaped, upper portion SL2L of the slit SL2 is equal to width d, the gap between the left-hand edge in the drawing of the bank 23B and the eave-shaped, upper portion SL1R of the slit SL1 is equal to width f, and the gap between the right-hand edge in the drawing of the edge cover 23E and the eave-shaped, upper portion SL1L of the slit SL1 is equal to width h. Width d, width f, and width h may have either different values or an equal value.

Thereafter, in the step of dividing (step S13 shown in FIG. 7), the display devices 1 each having the through hole H can be obtained by dividing the large-sized substrate into the display devices 1.

Finally, in the step of attaching the functional film 39 (step S14 shown in FIG. 7), as shown in FIG. 2, the functional film 39 is attached onto the second inorganic sealing film 28 in the sealing layer 6.

Embodiment 2

Figure 8:
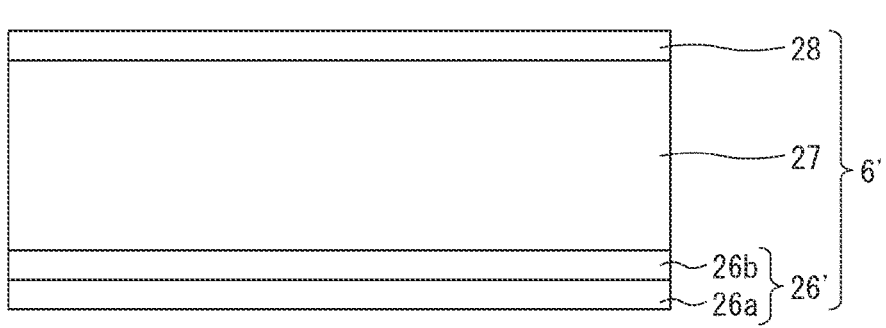
In FIG. 8, (a) is a cross-sectional view of a sealing layer in a display device in accordance with Embodiment 2, and (b) is a cross-sectional view of a sealing layer in a display device that is a variation example of Embodiment 2.
Figure 8:
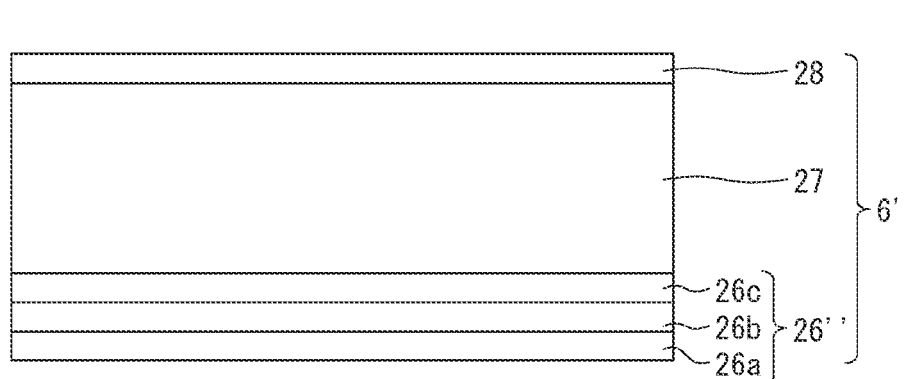

Next, a description is given of Embodiment 2 of the disclosure with reference to FIG. 8. The display device in accordance with the present embodiment differs from Embodiment 1 described above in that the former includes a sealing layer 6' or a sealing layer 6" and is otherwise as described in Embodiment 1. For convenience of description, members of the present embodiment that have the same function as members shown in the drawings for Embodiment 1 are indicated by the same reference numerals, and description thereof is omitted.

Portion (a) of FIG. 8 is a cross-sectional view of the sealing layer 6' in the display device in accordance with Embodiment 2, and (b) of FIG. 8 is a cross-sectional view of the sealing layer 6" in a display device that is a variation example of Embodiment 2.

As shown in (a) of FIG. 8, the sealing layer 6' in the display device in accordance with Embodiment 2 includes: a first inorganic sealing film 26', an organic sealing film 27, and a second inorganic sealing film 28. The first inorganic sealing film 26' is a stack of a silicon nitride film (first inorganic film) 26a and a silicon nitroxide film (second inorganic film) 26b which are stacked in this order when viewed from the resin layer 15 (see FIG. 5).

In the sealing layer 6 shown in FIGS. 2 and 5, in some cases, the first inorganic sealing film 26 that is the lowermost layer may be formed of a silicon nitroxide film, and the second inorganic sealing film 28 that is the uppermost layer may be formed of a silicon nitride film to ensure barrier properties. However, in such a case, the first inorganic sealing film 26, which is the lowermost layer formed of a silicon nitroxide film, can be undesirably oxidized by external water content.

Meanwhile, the first inorganic sealing film 26, which is the lowermost layer, may be formed of a thick silicon nitride film, in which case the first inorganic sealing film 26, which is the lowermost layer, could have poor coating properties due to, for example, stress, cracking, and adherence problems caused by heat expansion differences.

Accordingly, the first inorganic sealing film 26' in the sealing layer 6' in the display device in accordance with the present embodiment is a stack of the silicon nitride film (first inorganic film) 26a and the silicon nitroxide film (second inorganic film) 26b which are stacked in this order when viewed from the resin layer 15 (see FIG. 5). Therefore, the silicon nitride film (first inorganic film) 26a can address the problem of progressive oxidation by external water content, and the silicon nitroxide film (second inorganic film) 26b can address the problem of coating properties. Note that the silicon nitride film (first inorganic film) 26a preferably has a thickness of at least 100 nm with a view to restraining the progress of oxidation by external water content, and the silicon nitroxide film (second inorganic film) 26b preferably has a thickness of at least 100 nm with a view to improving coating properties. Additionally, the second inorganic sealing film 28 in the sealing layer 6' is preferably formed of a silicon nitride film and more preferably formed of a silicon nitride film with a thickness of at least 200 nm with a view to ensuring higher reliability.

As shown in (b) of FIG. 8, the sealing layer 6" in the display device in accordance with a variation example of Embodiment 2 includes a first inorganic sealing film 26", an organic sealing film 27, and a second inorganic sealing film 28. The first inorganic sealing film 26" is a stack of a silicon nitride film (first inorganic film) 26a, a silicon nitroxide film (second inorganic film) 26b, and a silicon oxide film (third inorganic film) 26c, all of which are stacked in this order when viewed from the resin layer 15 (see FIG. 5). Therefore, the silicon nitride film (first inorganic film) 26a can address the problem of progressive oxidation by external water content, the silicon nitroxide film (second inorganic film) 26b can address the problem of coating properties, and the silicon oxide film (third inorganic film) 26c can improve the wettability of the organic sealing film 27 formed by, for example, inkjet printing. Note that the silicon nitride film (first inorganic film) 26a preferably has a thickness of at least 100 nm with a view to restraining the progress of oxidation by external water content, the silicon nitroxide film (second inorganic film) 26b preferably has a thickness of at least 100 nm with a view to addressing coating properties, and the silicon oxide film (third inorganic film) 26c preferably has a thickness of at least 20 nm with a view to improving the wettability. Additionally, the second inorganic sealing film 28 in the sealing layer 6″ is preferably formed of a silicon nitride film and more preferably formed of a silicon nitride film with a thickness of at least 200 nm with a view to ensuring higher reliability.

Embodiment 3

Figure 9:
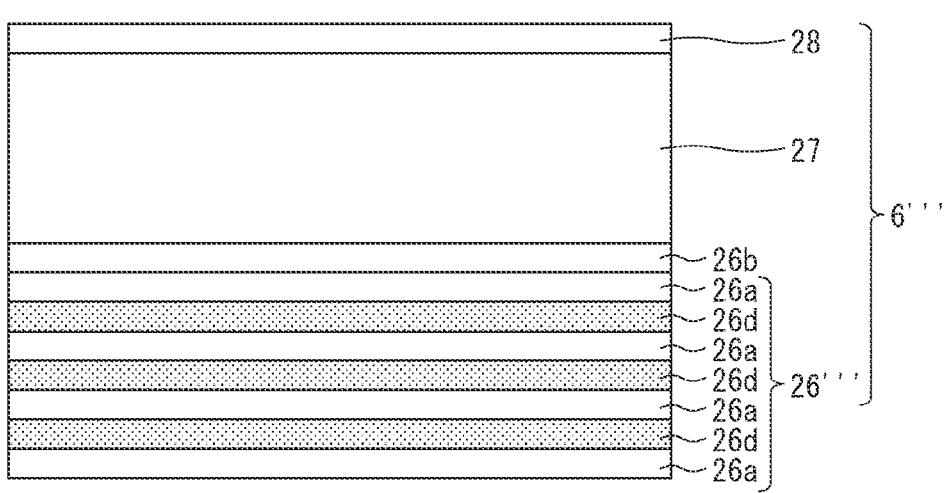
In FIG. 9, (a) is a cross-sectional view of a sealing layer in a display device in accordance with Embodiment 3, and (b) is a cross-sectional view of a sealing layer in a display device that is a variation example of Embodiment 3.
Figure 9:
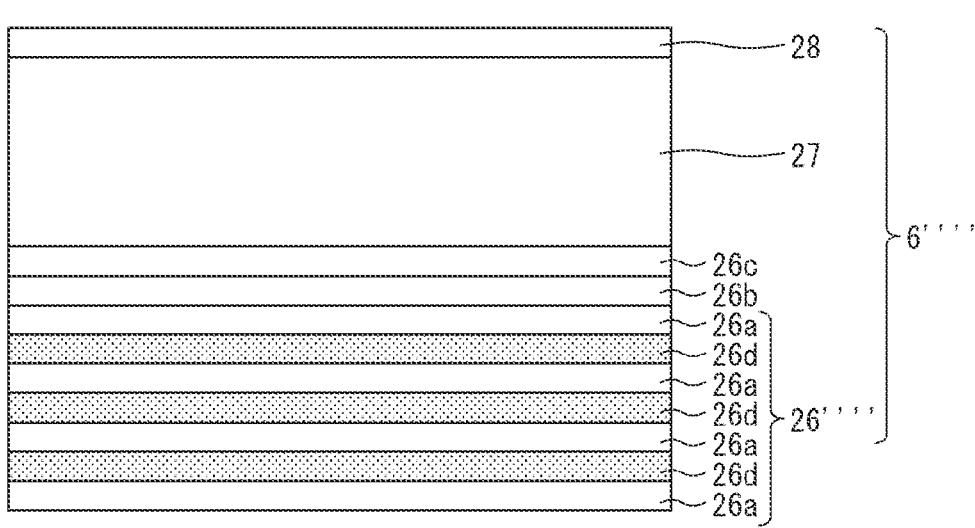

Next, a description given of Embodiment 3 of the disclosure with reference to FIG. 9. The display device in accordance with the present embodiment differs from Embodiments 1 and 2 described above in that the former includes a sealing layer 6‴ or a sealing layer 6″ and is otherwise as described Embodiments 1 and 2. For convenience of description, members of the present embodiment that have the same function as members shown in the drawings for Embodiments 1 and 2 are indicated by the same reference numerals, and description thereof is omitted.

Portion (a) of FIG. 9 is a cross-sectional view of the sealing layer 6″ in the display device in accordance with Embodiment 3, and (b) of FIG. 9 is a cross-sectional view of the sealing layer 6″ in a display device in accordance with a variation example of Embodiment 3.

As shown in (a) of FIG. 9, the sealing layer 6″ in the display device in accordance with Embodiment 3 includes a first inorganic sealing film, an organic sealing film 27, and a second inorganic sealing film 28. The first inorganic sealing film is a stack of a first inorganic film 26‴ and a silicon nitroxide film (second inorganic film) 26b which are stacked in this order when viewed from the resin layer 15 (see FIG. 5). The first inorganic film 26″ is a stack of a silicon nitride film (first silicon nitride film) 26a, a silicon carbonitride film (first silicon carbonitride film) 26d, a silicon nitride film (second silicon nitride film) 26a, a silicon carbonitride film (second silicon carbonitride film) 26d, a silicon nitride film (third silicon nitride film) 26a, a silicon carbonitride film (third silicon carbonitride film) 26d, and a silicon nitride film (fourth silicon nitride film) 26a, all of which are stacked in this order when viewed from the resin layer 15 (see FIG. 5).

Although the present embodiment discusses an example where the silicon nitride film (first silicon nitride film) 26a has a thickness of 500 nm, the silicon carbonitride film (first silicon carbonitride film) 26d has a thickness of 500 nm, the silicon nitride film (second silicon nitride film) 26a has a thickness of 500 nm, the silicon carbonitride film (second silicon carbonitride film) 26d has a thickness of 500 nm, the silicon nitride film (third silicon nitride film) 26a has a thickness of 500 nm, the silicon carbonitride film (third silicon carbonitride film) 26d has a thickness of 500 nm, the silicon nitride film (fourth silicon nitride film) 26a has a thickness of 500 nm, and the first inorganic film 26″ has a thickness of 3.5 μm, this is not the only possible implementation of the disclosure. Alternatively, for example, the silicon nitride film (first silicon nitride film) 26a, the silicon nitride film (second silicon nitride film) 26a, the silicon nitride film (third silicon nitride film) 26a, and the silicon nitride film (fourth silicon nitride film) 26a may have a thickness of at least 150 nm and a thickness of at least 1,500 nm respectively. Additionally, the silicon carbonitride film (first silicon carbonitride film) 26d, silicon carbonitride film (second silicon carbonitride film), and the silicon carbonitride film (third silicon carbonitride film) 26d may each have a thickness of 100 nm to 1,000 nm, both inclusive.

According to this structure, the use of the first inorganic film 26″ in which the silicon nitride film 26a and the silicon carbonitride film 26d are alternately stacked enables controlling the compression and stretching of the film, thereby realizing the sealing layer 6″ in which the stress is relaxed. For example, a stress of −100 mpa would occur in a silicon nitride film with a thickness of 500 nm, and a stress of +10 to 30 mpa would occur in a silicon carbonitride film with a thickness of 500 nm. Stress can be relaxed by alternately stacking these films.

In addition, since the lowermost layer in the first inorganic sealing film in the sealing layer 6‴ is the silicon nitride film (first silicon nitride film) 26a, the progress of oxidation by external water content can be restrained. Furthermore, since the uppermost layer in the first inorganic sealing film in the sealing layer 6″ is the silicon nitroxide film 26b, the problem of coating properties can also be addressed.

In the present embodiment, although the silicon nitride film 26a is formed, for example, to a thickness of 150 nm to 1,500 nm by plasma CVD using gaseous $SiH_4$, gaseous $NH_3$, gaseous $N_2$, and gaseous $H_2$ at a vapor deposition power of 750 to 1,000 kw, and the silicon carbonitride film 26d is formed, for example, to a thickness of 100 nm to 1,000 nm by plasma CVD using gaseous $SiH_4$, gaseous $NH_3$, gaseous $C_2H_2$, and gaseous $H_2$ at a vapor deposition power of 400 to 700 kw, this is not the only possible implementation of the disclosure.

In addition, the second inorganic sealing film 28 in the sealing layer 6″ is preferably formed of a silicon nitride film and more preferably formed of a silicon nitride film with a thickness of at least 200 nm with a view to ensuring higher reliability.

Note that although the present embodiment, as described above, discusses an example where the first inorganic film 26″ is composed of 7 layers, this is not the only possible implementation of the disclosure. Alternatively, for example, the first inorganic film 26‴ needs only to include a silicon nitride film that is the lowermost layer that is the closest to the resin layer 15 (see FIG. 5), a silicon nitride film that is the uppermost layer that is the farthest from the resin layer 15 (see FIG. 5), and a silicon carbonitride film between the silicon nitride film that is the lowermost layer and the silicon nitride film that is the uppermost layer.

As shown in (b) of FIG. 9, the sealing layer 6″ in the display device in accordance with a variation example of Embodiment 3 includes the first inorganic sealing film, the organic sealing film 27, and the second inorganic sealing film 28, the first inorganic sealing film being a stack of a first inorganic film 26″, a silicon nitroxide film (second inorganic film) 26b, and a silicon oxide film (third inorganic film) 26c, all of which are stacked in this order when viewed from the resin layer 15 (see FIG. 5). The first inorganic film 26″ has the same structure as the structure of the first inorganic film 26″, and the description thereof is therefore omitted here.

According to this structure, the use of the first inorganic film 26″″ in which the silicon nitride film 26a and the silicon carbonitride film 26d are alternately stacked enables controlling the compression and stretching of the film, thereby realizing the sealing layer 6″ in which the stress is relaxed.

In addition, since the lowermost layer in the first inorganic sealing film in the sealing layer 6″ is the silicon nitride film (first silicon nitride film) 26a, the progress of oxidation by external water content can be restrained, and the silicon nitroxide film (second inorganic film) 26b can address the problem of coating properties, thereby enabling the silicon oxide film (third inorganic film) 26c to improve, for example, the wettability of the organic sealing film 27 formed by inkjet printing.

In addition, the second inorganic sealing film 28 in the sealing layer 6" is preferably formed of a silicon nitride film and more preferably formed of a silicon nitride film with a thickness of at least 200 nm with a view to ensuring higher reliability.

Embodiment 4

Figure 10:
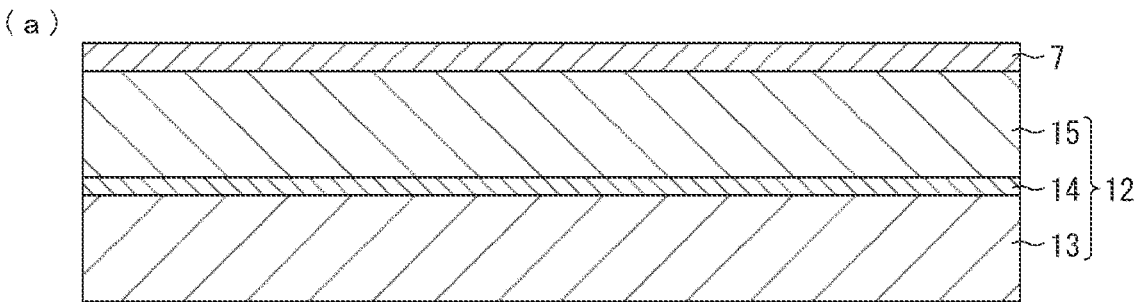
In FIG. 10, (a), (b), and (c) illustrate some manufacturing steps of a display device in accordance with Embodiment 4.
Figure 10:
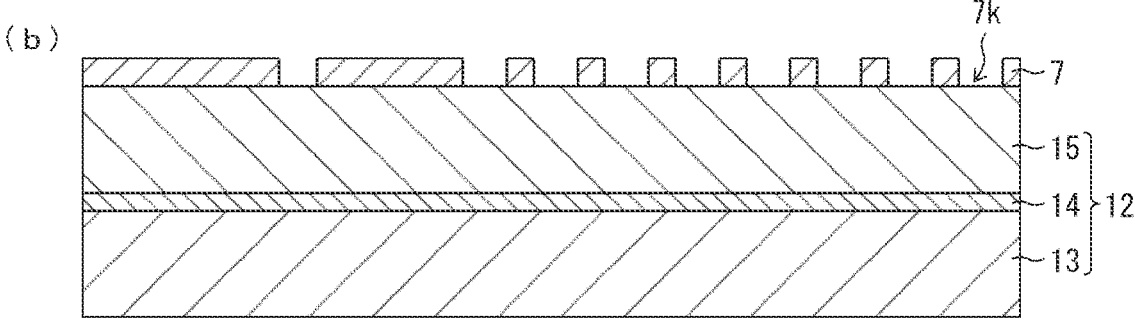
Figure 10:
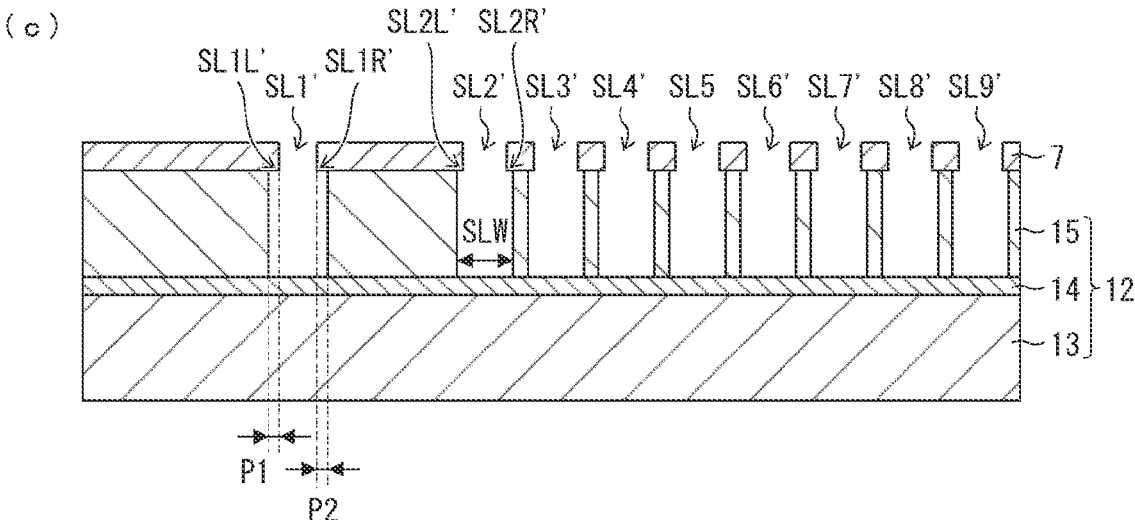

Next, a description is given of Embodiment 4 of the disclosure with reference to FIG. 10. The display device in accordance with the present embodiment differs from Embodiment 1 described above in that in the former, slits SL1' to SL9' formed in an eave-like shape have upper portions SL1L', SL1R', SL2L', and SL2R' that are formed of at least one of a plurality of inorganic insulating films (extension 7) and is otherwise as described in Embodiment 1. For convenience of description, members of the present embodiment that have the same function as members shown in the drawings for Embodiment 1 are indicated by the same reference numerals, and description thereof is omitted.

Portions (a) of FIG. 10, (b) of FIG. 10, and (c) of FIG. 10 illustrate some manufacturing steps of the display device in accordance with Embodiment 4. Note since that (a) of FIG. 10 and (b) of FIG. 10 have already been described on the basis of (a) of FIG. 3 and (b) of FIG. 3 of Embodiment 1, the description thereof is omitted here.

As shown in (c) of FIG. 10, in the step of forming the slits SL1' to SL9', the resin layer 15 is subjected to ashing at least partway through the thickness thereof through the slitty openings 7k shown in (b) of FIG. 10, thereby forming the slits SL1' to SL9' and imparting an eave-like shape to an upper portion of at least either one of the opposing side faces of the slits SL1' to SL9'. Note that each of the slits SL1' to SL9' has the above-described slitty openings 7k shown in (b) of FIG. 10. In this step, the resin layer 15 is subjected to ashing at least partway through the thickness thereof by using as a mask the extension 7 formed by extending at least one of the plurality of inorganic insulating films. In the present embodiment, the upper portion (e.g., the slit upper portions SL1L', SL1R', SL2L', and SL2R') of at least either one of the two opposing side faces of the slits SL1' to SL9' including at least one of the plurality of inorganic insulating films (extension 7) is shaped like an eave protruding toward the other side face of the slits SL1' to SL9' as shown in (c) of FIG. 10. For example, the upper portion SL1L' of the left-hand side face in the drawing of the slit SL1' can be shaped like an eave so as to protrude in a slit width direction SLW (left and right direction in the drawing) from a portion other than the upper portion SL1L' of the left-hand side face in the drawing of the slit SL1', by side-etching the resin layer 15 by anisotropic etching in dry ashing using, for example, gaseous oxygen. In other words, the extension 7 that is the upper portion SL1L' of the left-hand side face in the drawing of the slit SL1' is formed in an eave-like shape in the resin layer 15 that is a portion other than the upper portion SL1L' of the left-hand side face in the drawing of the slit SL1'. Note that an eave length P1 is defined as a maximum of the length by which the upper portion SL1L' of one of the side faces of the slit SL1' protrudes in the slit width direction SLW from a portion other than the upper portion SL1L' of one of the side faces of the slit SL1'. Similarly, the upper portion SL1R' of the right-hand side face in the drawing of the slit SL1' cam be shaped like an eave so as to protrude in the slit width direction SLW (left and right direction in the drawing) from a portion other than the upper portion SL1R' of the right-hand side face in the drawing of the slit SL1', by side-etching the resin layer 15. In other words, the extension 7 that is the upper portion SL1R' of the right-hand side face in the drawing of the slit SL1' is formed in an eave-like shape in the resin layer 15 that is a portion other than the upper portion SL1R' of the right-hand side face in the drawing of the slit SL1'. Note that an eave length P2 is defined as a maximum of the length by which the upper portion SL1R' of one of the side faces of the slit SL1' protrudes in the slit width direction SLW from a portion other than the upper portion SL1R' of one of the side faces of the slit SL1'. Note that the lengths of the eave length P1 and the eave length P2 are not limited in any particular manner and are preferably from 1.2 μm to 2.4 μm, both inclusive. When the lengths of the eave length P1 and the eave length P2 are from 1.2 μm to 2.4 μm, both inclusive, the above-described organic film 8 can be restrained from being formed as a continuous film from the face where the through hole H is provided to the display area DA, and the first inorganic sealing film 26 can be formed as a continuous film in the display area DA and the non-display area NDA.

Embodiment 5

Figure 11:
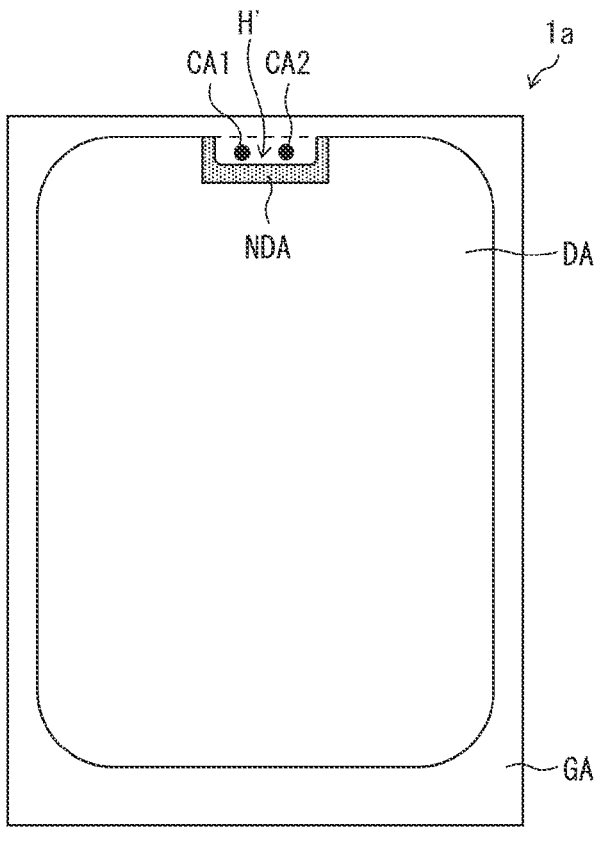
FIG. 11 is a schematic plan view of a structure of a display device in accordance with Embodiment 5.

Next, a description is given of Embodiment 5 of the disclosure with reference to FIG. 11. The display device 1a in accordance with the present embodiment differs from Embodiment 1 described above in that the former has a quadrilateral through hole H' and is otherwise as described in Embodiment 1. For convenience of description, members of the present embodiment that have the same function as members shown in the drawings for Embodiment 1 are indicated by the same reference numerals, and description thereof is omitted.

FIG. 11 is a schematic plan view of a structure of the display device 1a in accordance with Embodiment 5.

Referring to FIG. 11, the display device 1a includes a frame area GA, a display area DA, a non-display area NDA, and the through hole H'. The through hole (imaging aperture) H' is hole for directing light from the subject to a first imaging element CA1 and a second imaging element CA2. In the present embodiment, the left-hand side, the right-hand side, and the bottom side of the through hole H' are surrounded by the display area DA, whereas the top side of the through hole H' is not surrounded by the display area DA. Then, the left-hand side, the right-hand side, and the bottom side of the through hole H', in other words, those sides surrounded by the display area DA, are provided with the non-display area NDA including slits. Therefore, the non-display area NDA including slits is provided between display area DA and the through hole H'.

General Description

Aspect 1
A display device including:
a resin layer;
a thin film transistor layer provided on the resin layer and including a plurality of inorganic insulating films;
a display area including a plurality of subpixels each including a light-emitting element including: a first electrode; a functional layer containing a light-emitting layer; and a second electrode, all of which are provided on the thin film transistor layer in a stated order when viewed from the thin film transistor layer;

a through hole at least partially surrounded by the display area and provided through the resin layer and all layers that are provided as overlying and underlying layers of the resin layer; and a non-display area provided between the display area and the through hole and including, in an extension of at least one of the plurality of inorganic insulating films from the display area and at least partway through a thickness of the resin layer, a slit formed so as to surround at least a part of the through hole, wherein the slit has two opposing side faces at least either one of which has an upper portion shaped like an eave protruding toward another one of the two opposing side faces of the slit, the upper portion including the at least one of the plurality of inorganic insulating films, and the at least one of the plurality of inorganic insulating films that is shaped like an eave is, in the slit, in direct contact with a first inorganic sealing film covering the display area and the non-display area including the slit.

Aspect 2

The display device of aspect 1, wherein an extension, from the display area, of the plurality of inorganic insulating films contained in the thin film transistor layer includes a barrier layer, a gate insulating film, and at least one inter-layer insulating film.

Aspect 3

The display device of aspect 1 or 2, wherein at least either one of the two opposing side faces of the slit has an upper portion shaped like an eave protruding toward another one of the two opposing side faces of the slit, the upper portion including the at least one of the plurality of inorganic insulating films and a part of the resin layer.

Aspect 4

The display device of any one of aspects 1 to 3, wherein the two opposing side faces of the slit each have an upper portion shaped like an eave protruding toward another one of the two opposing side faces of the slit.

Aspect 5

The display device of any one of aspects 1 to 4, wherein the non-display area includes a plurality of the slits.

Aspect 6

The display device of any one of aspects 1 to 5, wherein the first inorganic sealing film is a stack of a first inorganic film and a second inorganic film, which are provided in a stated order when viewed from the resin layer, the first inorganic film is a silicon nitride film, and the second inorganic film is a silicon nitroxide film.

Aspect 7

The display device of any one of aspects 1 to 5, wherein the first inorganic sealing film is a stack of a first inorganic film, a second inorganic film, and a third inorganic film, all of which are provided in a stated order when viewed from the resin layer, the first inorganic film is a silicon nitride film, the second inorganic film is a silicon nitroxide film, and the third inorganic film is a silicon oxide film.

Aspect 8

The display device of any one of aspects 1 to 5, wherein the first inorganic sealing film is a stack of a first inorganic film and a second inorganic film, which are provided in a stated order when viewed from the resin layer, the first inorganic film includes:

a silicon nitride film that is a lowermost layer that is closest to the resin layer;

a silicon nitride film that is an uppermost layer that is farthest from the resin layer; and a silicon carbonitride film between the silicon nitride film that is the lowermost layer and the silicon nitride film that is the uppermost layer, and the second inorganic film is a silicon nitroxide film.

Aspect 9

The display device of any one of aspects 1 to 5, wherein the first inorganic sealing film is a stack of a first inorganic film, a second inorganic film, and a third inorganic film, all of which are provided in a stated order when viewed from the resin layer, the first inorganic film includes:

a silicon nitride film that is a lowermost layer that is closest to the resin layer;

a silicon nitride film that is an uppermost layer that is farthest from the resin layer; and a silicon carbonitride film between the silicon nitride film that is the lowermost layer and the silicon nitride film that is the uppermost layer, the second inorganic film is a silicon nitroxide film, and the third inorganic film is a silicon oxide film.

Aspect 10

The display device of aspect 8 or 9, wherein the first inorganic film is a stack of a first silicon nitride film, a first silicon carbonitride film, a second silicon nitride film, a second silicon carbonitride film, a third silicon nitride film, a third silicon carbonitride film, and a fourth silicon nitride film, all of which are provided in a stated order when viewed from the resin layer, the first silicon nitride film, the second silicon nitride film, the third silicon nitride film, and the fourth silicon nitride film each have a thickness of from 150 nm to 1,500 nm, both inclusive, and the first silicon carbonitride film, the second silicon carbonitride film, and the third silicon carbonitride film each have a thickness of from 100 nm to 1,000 nm, both inclusive.

Aspect 11

The display device of any one of aspects 1 to 10, further including an organic sealing film of an organic resin material, wherein the organic sealing film is provided on the first inorganic sealing film in the display area and in a first region of the non-display area, the first region being continuous with the display area, and in the first region of the non-display area, the slit is filled by the organic sealing film.

Aspect 12

The display device of aspect 11, further including a second inorganic sealing film, wherein the second inorganic sealing film is provided on the organic sealing film in the display area and in the first region of the non-display area and provided on the first inorganic sealing film in a second region that is a part of the non-display area other than the first region.

Aspect 13

The display device of aspect 12, wherein the second inorganic sealing film is a silicon nitride film.

Aspect 14

The display device of any one of aspects 1 to 13, wherein the display device has an eave length of from 1.2 μm to 2.4 μm, both inclusive, the eave length being a maximum of a length by which the upper portion of one of the two opposing side faces of the slit that is shaped like an eave protrudes in a width direction of the slit from a portion other than the upper portion of one of the two opposing side faces of the slit that is shaped like an eave.

Aspect 15

The display device of any one of aspects 1 to 14, further including a resin substrate, wherein an intermediate layer containing an inorganic film and the resin layer are provided on the resin substrate in a stated order when viewed from the resin substrate.

Aspect 16

A method of manufacturing a display device, the method including:

a step of forming a resin substrate on a base body;

a step of forming an intermediate layer containing an inorganic film on the resin substrate;

a step of forming a resin layer on the intermediate layer;

a step of forming, on the resin layer: a thin film transistor layer containing a plurality of inorganic insulating films; and an extension of at least one of the plurality of inorganic insulating films;

a step of, after forming a slitty opening in the extension of the at least one of the plurality of inorganic insulating films, ashing the resin layer at least partway through a thickness of the resin layer via the opening to form a slit through the at least one of the plurality of inorganic insulating films and through the resin layer such that the slit has two opposing side faces at least either one of which has an upper portion shaped like an eave protruding toward another one of the two opposing side faces of the slit, the upper portion including the at least one of the plurality of inorganic insulating films;

a step, performed after the step of forming the slit, of forming a first electrode;

a step, performed after the step of forming the first electrode, of forming a functional layer containing a light-emitting layer;

a step, performed after the step of forming the functional layer containing the light-emitting layer, of forming a second electrode; and a step, performed after the step of forming the second electrode, of forming a first inorganic sealing film on the extension of the at least one of the plurality of inorganic insulating films and on the thin film transistor layer, the first inorganic sealing film being in direct contact with the at least one of the plurality of inorganic insulating films that is shaped like an eave in the slit.

Aspect 17

The method of manufacturing of aspect 16, wherein in the step of forming the slit, at least either one of the two opposing side faces of the slit has an upper portion shaped like an eave protruding toward another one of the two opposing side faces of the slit, the upper portion including the at least one of the plurality of inorganic insulating films and a part of the resin layer.

Aspect 18

The method of manufacturing of aspect 16 or 17, further including:

a step, performed after the step of forming the first inorganic sealing film, of forming an organic sealing film of an organic resin material; and a step, performed after the step of forming the organic sealing film, of forming a second inorganic sealing film.

Aspect 19

The method of manufacturing of aspect 18, further including:

a step, performed after the step of forming the second inorganic sealing film, of lifting off the resin substrate from the base body; and a step, performed after the step of lifting off, of forming a through hole, wherein in the step of forming the through hole, the through hole running through the resin substrate and through all layers that are provided as overlying layers of the resin substrate is formed so as to be adjacent to the thin film transistor layer with the slit being interposed, the resin substrate and all the layers provided as the overlying layers of the resin substrate being the extension of the at least one of the plurality of inorganic insulating films.

Additional Remarks

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

Industrial Applicability

The disclosure is applicable to display devices and methods of manufacturing a display device.

The invention claimed is:

1. A display device comprising:

a resin layer;

a thin film transistor layer provided on the resin layer and including a plurality of inorganic insulating films;

a display area including a plurality of subpixels each including a light-emitting element including: a first electrode; a functional layer containing a light-emitting layer; and a second electrode, all of which are provided on the thin film transistor layer in a stated order when viewed from the thin film transistor layer;

a through hole at least partially surrounded by the display area and provided through the resin layer and all layers that are provided as overlying and underlying layers of the resin layer; and a non-display area provided between the display area and the through hole and including, in an extension of at least one of the plurality of inorganic insulating films from the display area and at least partway through a thickness of the resin layer, a slit formed so as to surround at least a part of the through hole, wherein the slit has two opposing side faces at least either one of which has an upper portion shaped like an eave protruding toward another one of the two opposing side faces of the slit, the upper portion including the at least one of the plurality of inorganic insulating films, and the at least one of the plurality of inorganic insulating films that is shaped like an eave is, in the slit, in direct contact with a first inorganic sealing film covering the display area and the non-display area including the slit.

2. The display device according to claim 1, wherein the extension, from the display area, of the plurality of inorganic insulating films contained in the thin film transistor layer includes a barrier layer, a gate insulating film, and at least one interlayer insulating film.

3. The display device according to claim 1, wherein at least either one of the two opposing side faces of the slit has an upper portion shaped like an eave protruding toward another one of the two opposing side faces of the slit, the upper portion including the at least one of the plurality of inorganic insulating films and a part of the resin layer.

4. The display device according to claim 1, wherein the two opposing side faces of the slit each have an upper portion shaped like an eave protruding toward another one of the two opposing side faces of the slit.

5. The display device according to claim 1, wherein the non-display area comprises a plurality of the slits.

6. The display device according to claim 1, wherein
the first inorganic sealing film is a stack of a first inorganic film and a second inorganic film, which are provided in a stated order when viewed from the resin layer,
the first inorganic film is a silicon nitride film, and
the second inorganic film is a silicon nitroxide film.

7. The display device according to claim 1, wherein
the first inorganic sealing film is a stack of a first inorganic film, a second inorganic film, and a third inorganic film, all of which are provided in a stated order when viewed from the resin layer,
the first inorganic film is a silicon nitride film,
the second inorganic film is a silicon nitroxide film, and
the third inorganic film is a silicon oxide film.

8. The display device according to claim 1, wherein
the first inorganic sealing film is a stack of a first inorganic film and a second inorganic film, which are provided in a stated order when viewed from the resin layer,
the first inorganic film includes:
a silicon nitride film that is a lowermost layer that is closest to the resin layer;
a silicon nitride film that is an uppermost layer that is farthest from the resin layer; and
a silicon carbonitride film between the silicon nitride film that is the lowermost layer and the silicon nitride film that is the uppermost layer, and
the second inorganic film is a silicon nitroxide film.

9. The display device according to claim 8, wherein
the first inorganic film is a stack of a first silicon nitride film, a first silicon carbonitride film, a second silicon nitride film, a second silicon carbonitride film, a third silicon nitride film, a third silicon carbonitride film, and a fourth silicon nitride film, all of which are provided in a stated order when viewed from the resin layer,
the first silicon nitride film, the second silicon nitride film, the third silicon nitride film, and the fourth silicon nitride film each have a thickness of from 150 nm to 1,500 nm, both inclusive, and
the first silicon carbonitride film, the second silicon carbonitride film, and the third silicon carbonitride film each have a thickness of from 100 nm to 1,000 nm, both inclusive.

10. The display device according to claim 1, wherein
the first inorganic sealing film is a stack of a first inorganic film, a second inorganic film, and a third inorganic film, all of which are provided in a stated order when viewed from the resin layer,
the first inorganic film includes:
a silicon nitride film that is a lowermost layer that is closest to the resin layer;
a silicon nitride film that is an uppermost layer that is farthest from the resin layer; and
a silicon carbonitride film between the silicon nitride film that is the lowermost layer and the silicon nitride film that is the uppermost layer,
the second inorganic film is a silicon nitroxide film, and
the third inorganic film is a silicon oxide film.

11. The display device according to claim 1, further comprising an organic sealing film of an organic resin material, wherein the organic sealing film is provided on the first inorganic sealing film in the display area and in a first region of the non-display area, the first region being continuous with the display area, and
in the first region of the non-display area, the slit is filled by the organic sealing film.

12. The display device according to claim 11, further comprising a second inorganic sealing film, wherein the second inorganic sealing film is provided on the organic sealing film in the display area and in the first region of the non-display area and provided on the first inorganic sealing film in a second region that is a part of the non-display area other than the first region.

13. The display device according to claim 12, wherein the second inorganic sealing film is a silicon nitride film.

14. The display device according to claim 1, wherein the display device has an eave length of from 1.2 μm to 2.4 μm, both inclusive, the eave length being a maximum of a length by which the upper portion of one of the two opposing side faces of the slit that is shaped like an eave protrudes in a width direction of the slit from a portion other than the upper portion of one of the two opposing side faces of the slit that is shaped like an eave.

15. The display device according to claim 1, further comprising a resin substrate, wherein an intermediate layer containing an inorganic film and the resin layer are provided on the resin substrate in a stated order when viewed from the resin substrate.

16. A method of manufacturing a display device, the method comprising:
a step of forming a resin substrate on a base body;
a step of forming an intermediate layer containing an inorganic film on the resin substrate;
a step of forming a resin layer on the intermediate layer;
a step of forming, on the resin layer: a thin film transistor layer containing a plurality of inorganic insulating films; and an extension of at least one of the plurality of inorganic insulating films;
a step of, after forming a slitty opening in the extension of the at least one of the plurality of inorganic insulating films, ashing the resin layer at least partway through a thickness of the resin layer via the opening to form a slit through the at least one of the plurality of inorganic insulating films and through the resin layer such that the slit has two opposing side faces at least either one of which has an upper portion shaped like an eave protruding toward another one of the two opposing side faces of the slit, the upper portion including the at least one of the plurality of inorganic insulating films;
a step, performed after the step of forming the slit, of forming a first electrode;
a step, performed after the step of forming the first electrode, of forming a functional layer containing a light-emitting layer;
a step, performed after the step of forming the functional layer containing the light-emitting layer, of forming a second electrode; and
a step, performed after the step of forming the second electrode, of forming a first inorganic sealing film on the extension of the at least one of the plurality of inorganic insulating films and on the thin film transistor layer, the first inorganic sealing film being in direct contact with the at least one of the plurality of inorganic insulating films that is shaped like an eave in the slit.

17. The method of manufacturing according to claim 16, wherein in the step of forming the slit, at least either one of the two opposing side faces of the slit has an upper portion shaped like an eave protruding toward another one of the two opposing side faces of the slit, the upper portion including the at least one of the plurality of inorganic insulating films and a part of the resin layer.

18. The method of manufacturing according to claim 16, further comprising:

a step, performed after the step of forming the first inorganic sealing film, of forming an organic sealing film of an organic resin material; and a step, performed after the step of forming the organic sealing film, of forming a second inorganic sealing film.

19. The method of manufacturing according to claim 18, further comprising:

a step, performed after the step of forming the second inorganic sealing film, of lifting off the resin substrate from the base body; and a step, performed after the step of lifting off, of forming a through hole, wherein in the step of forming the through hole, the through hole running through the resin substrate and through all layers that are provided as overlying layers of the resin substrate is formed so as to be adjacent to the thin film transistor layer with the slit being interposed, the resin substrate and all the layers provided as the overlying layers of the resin substrate being the extension of the at least one of the plurality of inorganic insulating films.

\* \* \* \* \*